(12) United States Patent
Ariizumi

(10) Patent No.: US 12,288,669 B2
(45) Date of Patent: Apr. 29, 2025

(54) METHOD AND APPARATUS FOR DETECTING DISCHARGE SITE

(71) Applicant: NuFlare Technology, Inc., Yokohama (JP)

(72) Inventor: Toru Ariizumi, Tama (JP)

(73) Assignee: NuFlare Technology, Inc., Yokohama (JP)

( * ) Notice: Subject to any disclaimer, the term of this patent is extended or adjusted under 35 U.S.C. 154(b) by 389 days.

(21) Appl. No.: 17/838,764

(22) Filed: Jun. 13, 2022

(65) Prior Publication Data

US 2023/0028337 A1  Jan. 26, 2023

(30) Foreign Application Priority Data

Jul. 21, 2021 (JP) .................. 2021-120646

(51) Int. Cl.
*H01J 37/30* (2006.01)

(52) U.S. Cl.
CPC ..... *H01J 37/3005* (2013.01); *H01J 2237/026* (2013.01); *H01J 2237/06375* (2013.01)

(58) Field of Classification Search
None
See application file for complete search history.

(56) References Cited

U.S. PATENT DOCUMENTS

| 6,753,499 | B1 * | 6/2004 | Yasaka | ................. | G01N 29/223 |
| | | | | | 374/117 |
| 2006/0100824 | A1 * | 5/2006 | Moriya | ............. | H01J 37/32935 |
| | | | | | 702/57 |
| 2017/0154752 | A1 | 6/2017 | Essers et al. | | |

FOREIGN PATENT DOCUMENTS

| CN | 1365596 | A | | 8/2002 |
| CN | 212622763 | U | * | 2/2021 |
| JP | S63-216342 | A | | 9/1988 |
| JP | 6-124679 | A | | 5/1994 |
| JP | 2004095981 | A | * | 3/2004 |
| JP | 2007335786 | A | * | 12/2007 |
| JP | 2010-232129 | A | | 10/2010 |
| JP | 2011077180 | A | * | 4/2011 |
| JP | 2012-44051 | A | | 3/2012 |
| JP | 2012-114127 | A | | 6/2012 |
| JP | 2014-165202 | A | | 9/2014 |

(Continued)

OTHER PUBLICATIONS

Machine translation of JP 2004-95981 A (Year: 2004).*

(Continued)

*Primary Examiner* — Robert H Kim
*Assistant Examiner* — Alina Kaliszewski
(74) *Attorney, Agent, or Firm* — Oblon, McClelland, Maier & Neustadt, L.L.P.

(57) ABSTRACT

A method for detecting a discharge site for a charged particle beam emitting apparatus includes switchable first and second modes. The first mode enables a beam of charged particles to be deflected by applying voltages to electrodes. The second mode enables acquisition of data items indicative of potential of each of the electrodes while the beam is being emitted without applying the voltages. The method includes, in the second mode, detecting an occurrence of a discharge when a fluctuation in potential indicated by data items relating to one of the electrodes exceeds a predetermined threshold value; and detecting a site corresponding to the electrode, as a site having an occurrence of the discharge.

13 Claims, 10 Drawing Sheets

(56) References Cited

FOREIGN PATENT DOCUMENTS

| JP | 2015135847 A | * | 7/2015 | |
|---|---|---|---|---|
| JP | 2016-134306 A | | 7/2016 | |
| JP | 2020-47476 A | | 3/2020 | |
| WO | WO-2010001583 A1 | * | 1/2010 | ........ H01J 37/32935 |

OTHER PUBLICATIONS

Machine Translation of JP 2007335786 A (Year: 2007).*
Machine translation of WO 2010001583 A1 (Year: 2010).*
Machine Translation of JP 2011077180 A (Year: 2011).*
Machine Translation of JP 2015135847 A (Year: 2015).*
English machine translation for CN 212622763 U (Year: 2021).*
English machine translation for JP-2011077180-A (Year: 2011).*
Combined Taiwanese Office Action and Search Report issued Apr. 20, 2023 in Patent Application No. 111122581 (with machine translation), 13 pages.
Office Action issued Sep. 3, 2024, in corresponding Japanese Patent Application No. 2021-120646 (with English Translation), citing documents 1, 15-19 therein, 5 pages.
Korean Office Action issued Aug. 13, 2024 in Korean Patent Application No. 10-2022-0082910 (with unedited computer-generated English translation), citing document 15 therein, 9 pages.

* cited by examiner

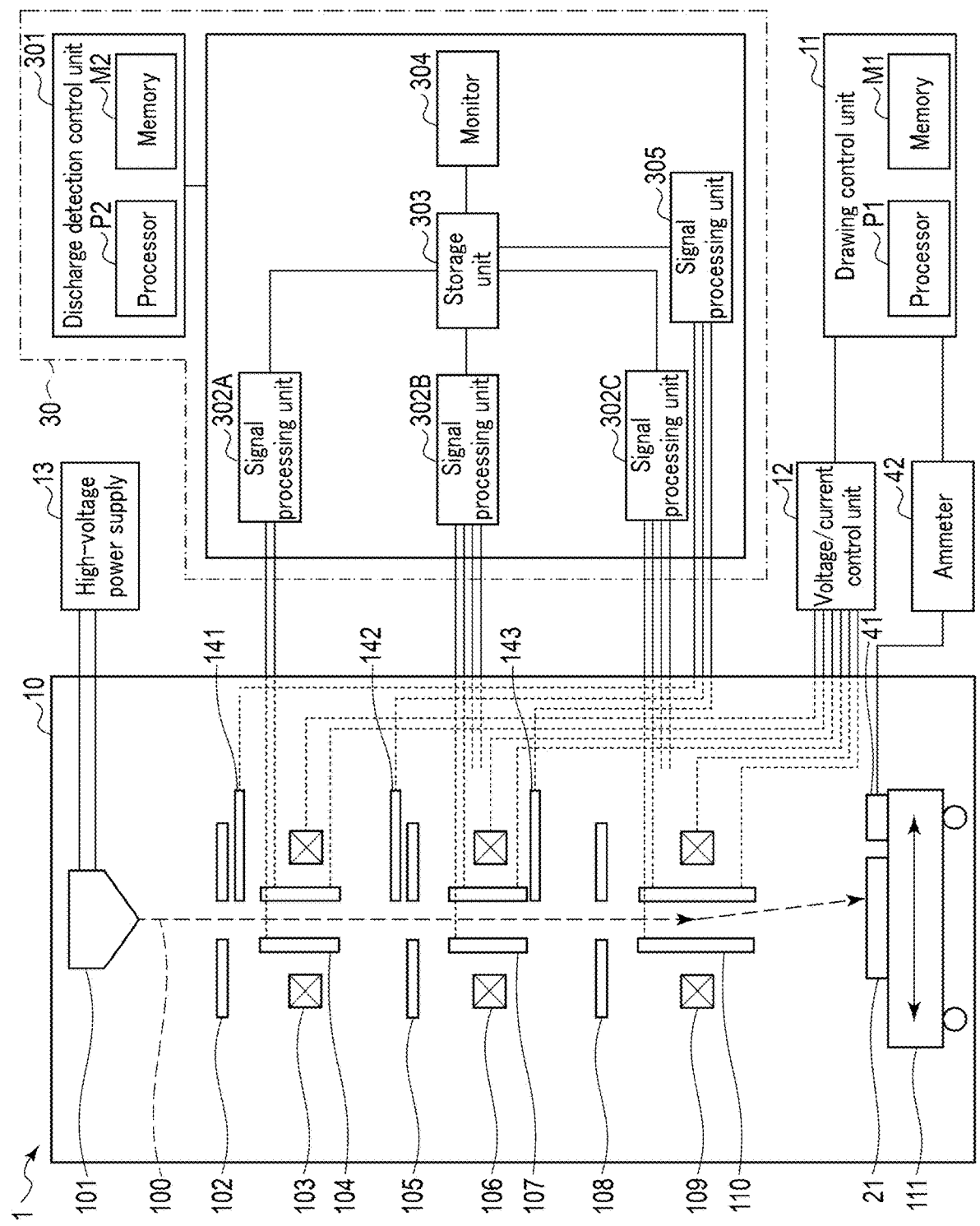
F I G. 1

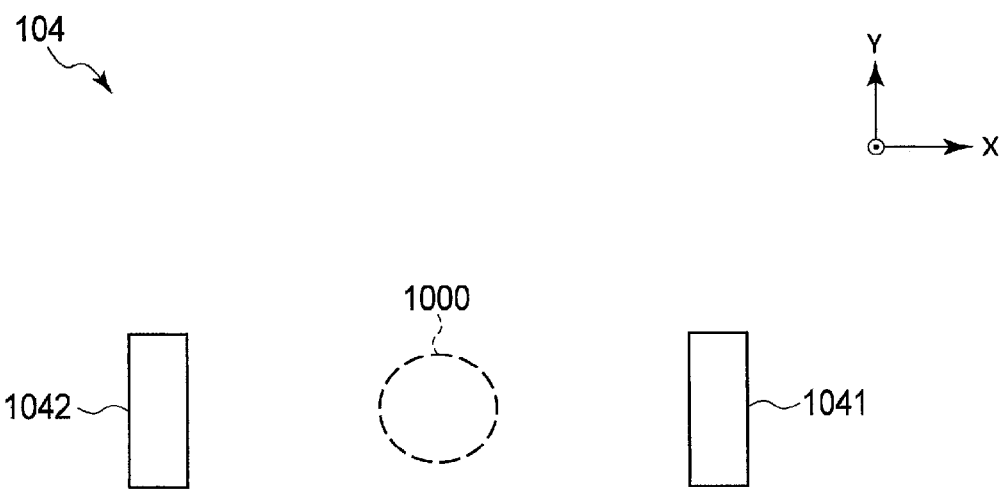
F I G. 2
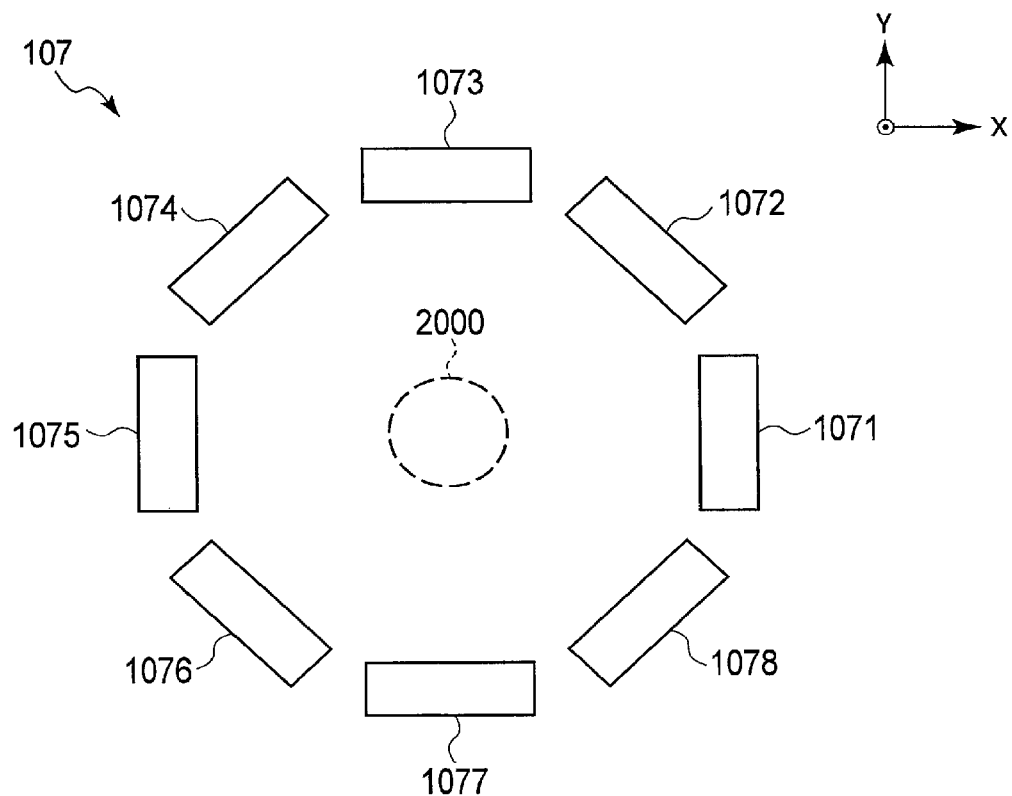
F I G. 3

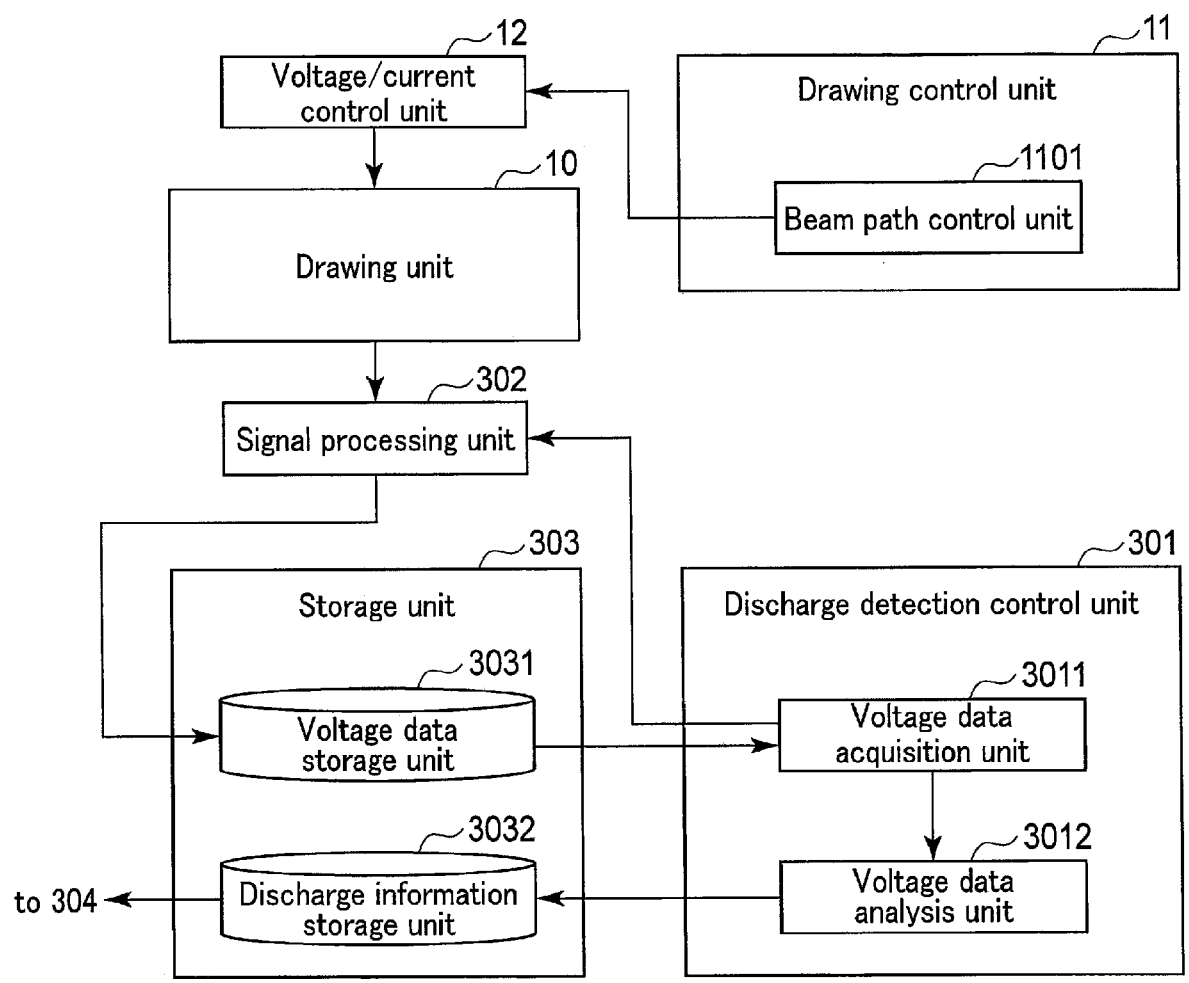
F I G. 4

METHOD AND APPARATUS FOR DETECTING DISCHARGE SITE

CROSS-REFERENCE TO RELATED APPLICATIONS

This application is based upon and claims the benefit of priority from Japanese Patent Application No. 2021-120646, filed Jul. 21, 2021, the entire contents of which are incorporated herein by reference.

FIELD

Embodiments described herein relate generally to a method and an apparatus for detecting a discharge site.

BACKGROUND

Lithography technology is used in processes for forming wiring patterns for semiconductor devices, and plays an extremely important role in the manufacturing process of semiconductor devices. In recent years, a line width of wiring required for semiconductor devices has been made finer year by year with the greater implementation of large scale integration (LSI).

A high-precision original image pattern (also referred to as a reticle or a mask) is used to form a wiring pattern with a line width made fine. The production of a high-precision original image pattern uses, for example, an electron beam drawing technique having excellent resolution. As an apparatus for producing an original image pattern using the electron beam drawing technique, an electron beam drawing apparatus of a variable beam shaping type is known.

The electron beam drawing apparatus variously shapes an electron beam by various beam shaping methods, and irradiates a sample with the shaped electron beam. By this irradiation, drawing is performed on the sample and an original image pattern is thus produced.

Herein, the electron beam drawing apparatus may internally include, for example, a component of an insulating material and in some cases, an unintended insulating material or particles. The insulating material or particles, etc., may be charged and discharged by scattered electrons. The discharge causes momentary fluctuations in the electric field in the apparatus, and the fluctuation may cause fluctuations of the path of electron beams. Fluctuations in the path of electron beams during drawing lead to, for example, a drawing pattern error.

In order to reduce the frequency of discharge described in the above, it is necessary to identify a location that causes a discharge and replace components. For example, a location that causes a discharge can be identified by visually searching or searching with a microscope for a discharge mark on a component. Furthermore, there is also known a technique in which a discharge is detected by a discharge detector provided in an electron beam drawing apparatus and a rough position of a location causing the discharge is estimated by detecting the discharge with the discharge detector (see, e.g., Jpn. Pat. Appln. KOKAI Publication No. 2016-134306 Jpn. Pat. Appln. KOKAI Publication No. 63-216342).

However, it is difficult to detect all discharges caused in the electron beam drawing apparatus with such a discharge detector. For example, in the case of a discharge being caused by an electrode of a deflector in the electron beam drawing apparatus, the discharge may not be detected. Even if a discharge detector detects fluctuations in the electron field caused by a discharge caused far away from the discharge detector, which is measured by a current detector capturing electromagnetic waves caused by the discharge as an antenna and converting a generated current change into a voltage, it is difficult to estimate a location that causes the discharge.

SUMMARY

The present invention has been made in view of the above circumstances, and an object of the present invention is to provide a method and an apparatus for detecting a discharge site, capable of improving a discharge detection accuracy.

A method for detecting a discharge site for a charged particle beam emitting apparatus includes switchable first and second modes. The first mode enables a beam of charged particles to be deflected by applying voltages to a plurality of electrodes. The second mode enables acquisition of data items indicative of potential of each of the plurality of the electrodes while the beam is being emitted without applying the voltages. The method includes, in the second mode, detecting an occurrence of a discharge when a fluctuation in potential indicated by data items relating to one of the electrodes exceeds a predetermined threshold value; and detecting a site corresponding to the electrode, as a site having an occurrence of the discharge.

BRIEF DESCRIPTION OF THE DRAWINGS

FIG. 1 is a schematic configuration view showing an example of a configuration of an electron beam drawing apparatus according to a first embodiment.

FIG. 2 is a schematic configuration view showing an example of a configuration of a lighting deflector of the electron beam drawing apparatus according to the first embodiment.

FIG. 3 is a schematic configuration view showing an example of a configuration of a projection deflector of the electron beam drawing apparatus according to the first embodiment.

FIG. 4 is a block diagram showing an example of configurations of a drawing control unit and a discharge detection control unit of the electron beam drawing apparatus according to the first embodiment.

DETAILED DESCRIPTION

Figure 5:
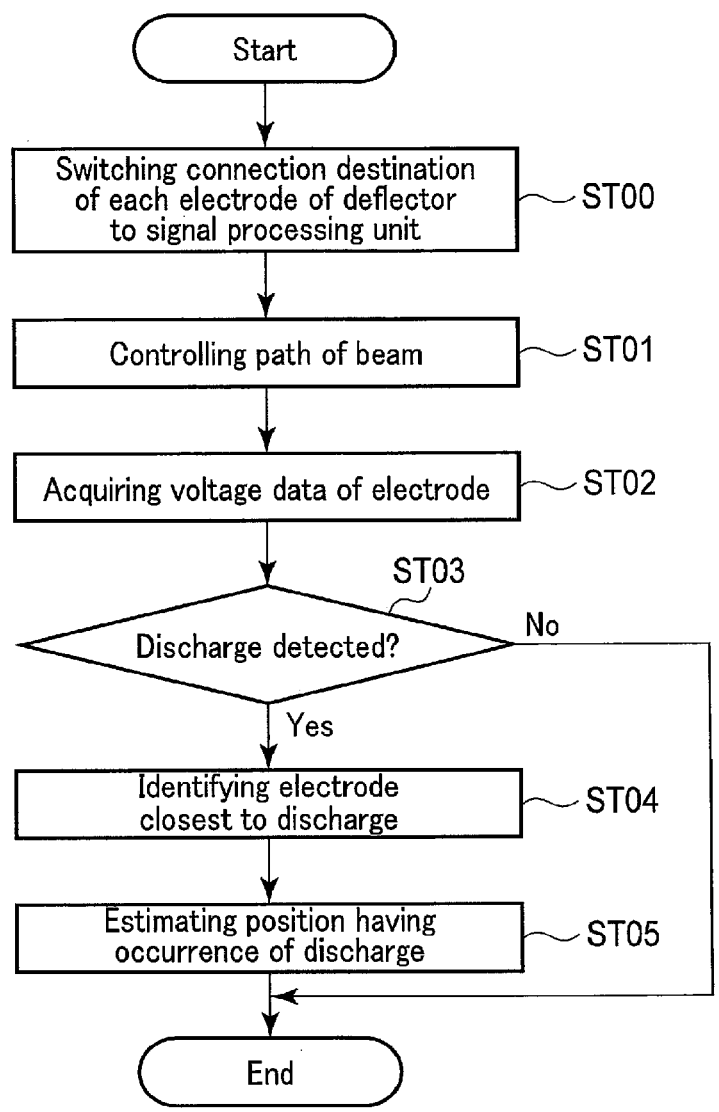
FIG. 5 is a flowchart showing an example of an operation in which a discharge is detected and which is executed by the electron beam drawing apparatus according to the first embodiment.

Hereinafter, embodiments will be described with reference to the drawings. In the following description, components having the same function and configuration will be assigned a common reference symbol. When a plurality of components assigned a common reference symbol are distinguished from each other, suffixes are added after the common reference symbol for the distinction. When the components need not be particularly distinguished from one another, the components are assigned only the common reference symbol without suffixes. The embodiments to be described below are mere exemplification of an apparatus and a method for embodying a technical idea, and the shape, configuration, and arrangement of each component are not limited to the ones described below.

Each function block can be implemented in the form of hardware, software, or a combination thereof. The function blocks are not necessarily separated from one another as described below. For example, some of the functions may be implemented by a function block other than the function blocks to be described as an example. In addition, the function blocks to be described as an example may be further divided into functional sub-blocks. The names of the function blocks and components in the following description are assigned for convenience, and do not limit the configurations or operations of the function blocks and components.

First Embodiment

Hereinafter, an electron beam drawing apparatus will be described as a non-limiting example of a charged particle beam emitting apparatus including a discharge site detection apparatus according to a present embodiment. However, the present embodiment is not limited to this. For example, the technique disclosed in the present embodiment is also applicable to other apparatuses using charged particle beams such as electron beams and ion beams. These apparatuses include, for example, a focused ion beam drawing apparatus, an original image pattern inspection apparatus, an electron microscope, a field emission ion microscope, etc. The beam used in these apparatuses is not limited to a single beam and may be a multi-beam.

Configuration Example (1) Electron Beam Drawing Apparatus

FIG. 1 is a schematic configuration view showing an example of a configuration of an electron beam drawing apparatus 1 according to a first embodiment. The configuration of the electron beam drawing apparatus 1 illustrated in FIG. 1 is only an example and is not limited to the illustrated one. For example, the electron beam drawing apparatus 1 may include components other than those illustrated in the figure which may be normally provided in an electron beam drawing apparatus. Furthermore, the arrangement of the respective structural elements in the electron beam drawing apparatus 1 may be different from the illustrated one.

The electron beam drawing apparatus 1 includes, for example, a drawing unit 10, a drawing control unit 11, a voltage/current control unit 12, and a high-voltage power supply 13.

The drawing unit 10 includes an electron gun 101, a first aperture member 102, a lighting coil 103, a lighting deflector 104, a second aperture member 105, a projection coil 106, a projection deflector 107, a third aperture member 108, an objective coil 109, an objective deflector 110, and a stage ill. A sample 21 may be fixed onto the stage 111. The electron beam drawing apparatus 1 performs drawing on the sample 21 fixed onto the stage 111 by using an electron beam 100 emitted from the electron gun 101.

In the following, two directions which are parallel to a surface of the stage 111, having the sample 21 fixed thereon, and which are, for example, orthogonal to each other, are defined as the X direction and the Y direction, respectively. The direction that intersects the surface and extends toward the electron gun 101 side from the surface is defined as the Z direction. The Z direction is described as being orthogonal to the X direction and the Y direction, but is not necessarily limited to this. In the following, the Z direction is referred to as "up" and the direction opposite to the Z direction will be referred to as "down"; however, this notation is merely for convenience and is irrelevant to, for example, the direction of gravity.

The high-voltage power supply 13 is coupled to the electron gun 101 and applies a high voltage thereto. In response to the application of the high-voltage, the electron gun 101 emits the electron beam 100. The drawing control unit 11 includes, for example, a processor P1 and a memory M1. The processor P1 is, for example, a central processing unit (CPU). The memory M1 is a memory for storing a program and/or data, such as a read only memory (ROM) or a random access memory (RAM). The drawing control unit 11 sends a control signal to the voltage/current control unit 12. The voltage/current control unit 12 controls, for example, a voltage applied to each electrode included in each of the lighting deflector 104, the projection deflector 107, and the objective deflector 110 based on the control signal, thereby controlling the electric field in a region through which the electron beam 100 passes. The voltage/current control unit 12 controls, for example, a current flowing through each of the lighting coil 103, the projection coil 106, and the objective coil 109 based on the control signal, thereby controlling the magnetic field in the region through which the electron beam 100 passes.

The first aperture member 102, the second aperture member 105, and the third aperture member 108 are provided, in this order from above, between the electron gun 101 and the stage 111.

The first aperture member 102 is provided with, for example, an aperture. The aperture is located, for example, at the center of a current distribution of the electron beam 100 on the upper surface of the first aperture member 102.

The lighting coil 103 and the lighting deflector 104 are provided, for example, between the first aperture member 102 and the second aperture member 105. The second aperture member 105 is provided with, for example, a rectangular aperture. The lighting deflector 104 includes, for example, two electrodes. The lighting deflector 104 may change a path of the electron beam 100 that has passed through the aperture of the first aperture member 102 by changing the electric field in the region sandwiched between these electrodes. For example, this change of the path brings the electron beam drawing apparatus 1 to either a beam ON state or a beam OFF state. In the beam ON state, a part of the electron beam 100 passes through the aperture provided in the second aperture member 105. In the beam OFF state, no part of the electron beam 100 passes through the aperture. The electron beam 100 that has passed through the second aperture member 105 is formed into, for example, a rectangle according to the aperture. For example, the electron beam drawing apparatus 1 may be in the beam ON state while a voltage of 0 V is applied to each electrode of the lighting deflector 104 and the path of the electron beam 100 is not changed by the lighting deflector 104. The lighting coil 103 is a deflection coil for beam alignment, also referred to as an alignment coil, for example, and is provided in such a manner as to surround the lighting deflector 104. The lighting coil 103 may change the path of the electron beam 100 by changing the magnetic field in the vicinity. Control for changing the path with the lighting coil 103 may be used, for example, for fine alignment of the path after control of the path with the lighting deflector 104.

By arranging the lighting coil 103 in such a manner as to surround the lighting deflector 104, the electric field in the region sandwiched between the electrodes of the lighting deflector 104 is changed, thereby changing the path of the electron beam 100 that has passed through the aperture of the first aperture member 102. However, the arrangement of the lighting coil 103 is not limited to those described above. The lighting coil 103 can be arranged at any position in the drawing unit 10.

The projection coil 106 and the projection deflector 107 are provided, for example, between the second aperture member 105 and the third aperture member 108. The third aperture member 108 is provided with an aperture. The projection deflector 107 includes, for example, eight electrodes. The projection deflector 107 may change a path of the electron beam 100 that has passed through the aperture of the second aperture member 105 by changing the electric field in the region sandwiched between these electrodes. By changing the path, the projection deflector 107 controls a position at which the electron beam 100 is projected on a plane including the upper surface of the third aperture member 108. The electron beam 100 projected on the plane includes a portion projected on the region of the aperture of the third aperture member 108, and this portion passes through the third aperture member 108. By this control, the shape and dimension of the electron beam 100 passing through the third aperture member 108 can be changed. For example, if a voltage of 0 V is applied to each electrode of the projection deflector 107 and the path of the electron beam 100 is not changed by the projection deflector 107, the entire electron beam 100 passes through the aperture of the third aperture member 108. The projection coil 106 is a deflection coil for beam alignment, also referred to as an alignment coil, for example, and is provided in such a manner as to surround the projection deflector 107. The projection coil 106 may change the path of the electron beam 100 by changing the magnetic field in the vicinity. Control for changing the path with the projection coil 106 may be used, for example, for fine alignment of the path after control of the path with the projection deflector 107.

By arranging the projection coil 106 in such a manner as to surround the projection deflector 107, the electric field in the region sandwiched between the electrodes of the projection deflector 107 is changed, thereby changing the path of the electron beam 100 that has passed through the aperture of the second aperture member 105. However, the arrangement of the projection coil 106 is not limited to those described in the above. The projection coil 106 can be arranged at any position in the drawing unit 10.

The objective coil 109 and the objective deflector 110 are provided, for example, between the third aperture member 108 and the stage 111. The stage 111 can continuously move, for example, in the X direction and the Y direction. The objective deflector 110 includes, for example, eight electrodes. The objective deflector 110 may change a path of the electron beam 100 that has passed through the aperture of the third aperture member 108 by changing the electric field in the region sandwiched between these electrodes. By changing the path, the objective deflector 110 controls a position at which the electron beam 100 is projected on the sample 21 on the stage 111 configured to continuously move. The objective coil 109 is a deflection coil for beam alignment, also referred to as an alignment coil, for example, and is provided in such a manner as to surround the objective deflector 110. The objective coil 109 may change the path of the electron beam 100 by changing the magnetic field in the vicinity. Control for changing the path with the objective coil 109 may be used, for example, for fine alignment of the path after control of the path with the objective deflector 110.

By arranging the objective coil 109 in such a manner as to surround the electrodes of the objective deflector 110, the electric field in the region sandwiched between the electrodes of the objective deflector 110 is changed, thereby changing the path of the electron beam 100 that has passed through the aperture of the third aperture member 108. However, the arrangement of the objective coil 109 is not limited to those described in the above. The objective coil 109 can be arranged at any position in the drawing unit 10.

For example, a Faraday cup 41 is provided at a position on the stage 111, which is different from the position at which the sample 21 is fixed. The Faraday cup 41 is coupled to, for example, an ammeter 42. The Faraday cup 41 and the ammeter 42 may be prepared separately from the electron beam drawing apparatus 1, or may be included in the electron beam drawing apparatus 1.

The Faraday cup 41 may capture electrons derived from the electron beam 100. The ammeter 42 measures a current according to electrons thus captured. The ammeter 42 sends, for example, a signal indicating the magnitude of the measured current to the drawing control unit 11.

In the drawing unit 10, an insulator, etc., may be charged and discharged by scattered electrons of the electron beam 100. For the purpose of detecting such a discharge, the electron beam drawing apparatus 1 may include the following configuration.

The drawing unit 10 may include current detectors 141, 142, and 143. Each of the current detectors 141, 142, and 143 is, for example, a metal plate that functions as an antenna. The current detector 141 is provided, for example, between the first aperture member 102 and the lighting deflector 104. The current detector 142 is provided, for example, between the lighting deflector 104 and the second aperture member 105. The current detector 142 detects a current by capturing reflected electrons from the electron beam 100 that has been reflected by the second aperture member 105 while swinging the beam by deflection. A value of the detected current is used to align a position at which the beam passes through to a desired position. The current detector 143 is provided, for example, between the projection deflector 107 and the third aperture member 108. The arrangement of each current detector is not limited to those described in the above. Each current detector can be arranged at any position in the drawing unit 10. Each current detector can detect fluctuations in an electric field in the vicinity of the current detector itself, caused by a discharge (fluctuations measured by the current detector capturing electromagnetic waves caused by the discharge as an antenna and converting a generated current change into a voltage).

The electron beam drawing apparatus 1 further includes a discharge detection unit 30. The discharge detection unit 30 may be prepared separately from the electron beam drawing apparatus 1, and in such a case, it can be coupled to the electron beam drawing apparatus 1. Among the structural elements included in the electron beam drawing apparatus 1, a given combination of components that may engage in detection of a discharge may be referred to as a discharge site detection apparatus. The discharge site detection apparatus includes, for example, a plurality of electrodes of the lighting deflector 104, the projection deflector 107, and the objective deflector 110, and the discharge detection unit 30.

The discharge detection unit 30 includes a discharge detection control unit 301, signal processing units 302A, 302B, and 302C, a storage unit 303, and a monitor 304. FIG. 1 shows that the discharge detection unit 30 further includes a signal processing unit 305. However, the signal processing unit 305 will be described in a modification to be described later.

The discharge detection control unit 301 controls detection of a discharge. The discharge detection control unit 301 includes, for example, a processor P2 and a memory M2. The processor P2 is, for example, a CPU. The memory M2 is a memory for storing a program and/or data, such as a ROM or a RAM.

Each of the signal processing units 302A-C is, for example, an oscilloscope. Each electrode of the lighting deflector 104 can be electrically connected to, for example, either the signal processing unit 302A or the voltage/current control unit 12. Throughout this description, a state in which each electrode is connected to a signal processing unit will be referred to as a sensor mode, and a state in which each electrode is connected to the voltage/current control unit 12 will be referred to as a deflection mode. Each electrode of the lighting deflector 104 is connected to the signal processing unit 302A via, for example, a MOS transistor. The control signal applied to a gate of the transistor controls the electrical connection between the electrode and the signal processing unit 302A. The control signal is supplied by, for example, the discharge detection control unit 301. Similarly, each electrode of the projection deflector 107 can be electrically connected to the signal processing unit 302B, and each electrode of the objective deflector 110 can be electrically connected to the signal processing unit 302C.

The storage unit 303 includes a storage medium such as a non-volatile memory which data can be written in and read from at any time, such as an HDD (Hard Disc Drive) or an SSD (Solid State Drive).

The signal processing unit 302A acquires analog data of a current based on a potential of an electrode connected to the signal processing unit 302A, performs analog-digital conversion processing on the analog data, and stores data items generated by this processing (hereinafter, also referred to as "voltage data items") in the storage unit 303. A voltage data item indicates, for example, a relationship between a potential of the electrode and time. In the following, for simplification of description, the electrode is also referred to as an electrode "corresponding to" the voltage data item, and the voltage data item is also referred to as a voltage data item "corresponding to" the electrode. The same applies to the following similar notations. The signal processing unit 302A acquires, in the case of being electrically connected to a plurality of electrodes, for example, analog data items of current in substantially the same time period for all of the connected electrodes. The signal processing unit 302A generates a voltage data item for each electrode as described above, and stores the generated voltage data item in the storage unit 303. The same applies to the signal processing units 302B and 302C. In order to make it possible to determine whether or not voltage data items respectively generated by the various signal processing units 302 are those in substantially the same time period, for example, clocks respectively used by the signal processing units 302A, 302B, and 302C may be the same or may be configured to be synchronous with each other. "Substantially the same" is an expression used to allow an error that may occur in the case where products are produced or manufactured so as to be the same, even if they are not necessarily the same. The same applies to the following similar expressions. Throughout this description, the terms "memory" and "record" are used interchangeably in connection with such storage of voltage data items in the storage unit 303.

The discharge detection control unit 301 reads out one or more voltage data items stored in the storage unit 303, performs, based on the one or more voltage data items, discharge detection processing for detecting fluctuations in electric field caused by a discharge (fluctuations measured by the current detector capturing electromagnetic waves caused by the discharge as an antenna and converting a generated current change into a voltage), and stores a result of this processing in the storage unit 303. A result of the processing stored in the storage unit 303 is displayed on the monitor 304, for example. Alternatively, the monitor 304 may display thereon a relationship between a potential and a time indicated by each of the one or more voltage data items stored in the storage unit 303. It is also possible to execute the discharge detection processing based on this display on the monitor 304.

(2) Deflector

FIG. 2 is a schematic configuration view showing an example of a configuration of the lighting deflector 104 of the electron beam drawing apparatus 1 according to the first embodiment. FIG. 2 shows, for example, a view of the lighting deflector 104 as viewed from above.

The lighting deflector 104 includes electrodes 1041 and 1042. Although FIG. 2 shows a case in which the lighting deflector 104 includes two electrodes, the present embodiment is not limited to the case shown in FIG. 2. Each of the electrodes 1041 and 1042 may be provided in such a manner as to have a shape other than the illustrated shape and/or an arrangement other than the illustrated arrangement, and the number of electrodes included in the lighting deflector 104 may be other than two.

The upper ends of the electrodes 1041 and 1042 are located at substantially the same position in, for example, the Z direction. The lower ends of the electrodes 1041 and 1042 are located at substantially the same position in, for example, the Z direction.

The electrodes 1041 and 1042 are provided in such a manner as to have intervals in, for example, the X direction. Each of the electrodes 1041 and 1042 has a flat plate shape extending in, for example, the Y direction and the Z direction. In such a case, for example, the electrode 1041 is configured in such a manner that the length in the Y direction and the length in the Z direction are longer than the length in the X direction. The electrode 1042 is configured in a similar manner. For example, the electrodes 1041 and 1042 are substantially the same in terms of length in the X direction, length in the Y direction, and length in the Z direction.

The voltage/current control unit 12 controls the electric field in a region between the electrodes 1041 and 1042 by applying a voltage to each of them. The electron beam 100 that has passed through the aperture of the first aperture member 102 passes through the region. FIG. 2 shows a region 1000 which is an example of the region in a plane in parallel to the X direction and the Y direction within the region.

FIG. 3 is a schematic configuration view showing an example of a configuration of the projection deflector 107 of the electron beam drawing apparatus 1 according to the first embodiment. FIG. 3 shows, for example, a view of the projection deflector 107 as viewed from above. The following will describe a configuration of the projection deflector 107; however, the objective deflector 110 and the projection deflector 107 may have similar configurations. The objective deflector 110 may have a configuration in which a plurality of configurations similar to that of the projection deflector 107 are stacked in the Z direction.

The projection deflector 107 includes electrodes 1071, 1072, 1073, . . . , and 1078. Although FIG. 3 shows a case in which the projection deflector 107 includes eight electrodes, the present embodiment is not limited to the case shown in FIG. 3. Each of the electrodes 1071, 1072, 1073, . . . , and 1078 may be provided in such a manner as to have a shape other than the illustrated shape and/or in an arrangement other than the illustrated arrangement, and the number of electrodes included in the projection deflector 107 may be other than eight.

The upper ends of all or a given combination of the electrodes 1071, 1072, 1073, . . . , 1078 are located at substantially the same position in, for example, the Z direction. The lower ends of all or a given combination of the electrodes 1071, 1072, 1073, . . . , 1078 are located at substantially the same position in, for example, the Z direction.

The direction in which each electrode is located around a straight line in parallel to the Z direction (hereinafter, also referred to as a "reference line") will be described. For example, the electron beam 100 travels on and along the reference line in the case where the electron beam 100 is not deflected with the lighting coil 103, the lighting deflector 104, the projection coil 106, and the projection deflector 107. The electrodes 1071, 1072, 1073, . . . , 1078 are provided in mutually different directions as viewed from the reference line. The following description will define a direction extending in, for example, the X direction from the reference line as a reference direction of 0°, and use an angle at which the counterclockwise direction as viewed from above is positive.

For example, a reference point in the electrode 1071 is located in the direction of 0° around the reference line. The reference point is a point at which, for example, the center or the center of gravity of the electrode 1071 is located. Hereinafter, the same applies to a case in which the term "reference point" is used for other electrodes. For example, the reference point in the electrode 1072 is located in the direction of 45° around the reference line. For example, the reference point in the electrode 1073 is located in the direction of 90° around the reference line. For example, the reference point in the electrode 1074 is located in the direction of 135° around the reference line. For example, the reference point in the electrode 1075 is located in the direction of 180° around the reference line. For example, the reference point in the electrode 1076 is located in the direction of 225° around the reference line. For example, the reference point in the electrode 1077 is located in the direction of 270° around the reference line. For example, the reference point in the electrode 1078 is located in the direction of 315° around the reference line.

The electrode 1071 has a flat plate shape extending in, for example, the Y direction and the Z direction. In such a case, for example, the electrode 1071 is configured in such a manner that the length in the Y direction and the length in the Z direction are longer than the length in the X direction. In the following, for simplification of description, a surface of a flat plate shaped electrode, which is greater in length in two directions than in the other direction, such as the surface of the electrode 1071, which extends in the Y direction and the Z direction, will be referred to as a flat-plate surface.

As with the electrode 1071, each of the electrodes 1072, 1073, . . . , and 1078 has a flat plate shape in which each of the lengths in two directions is longer than the length in the other direction of the electrode. As described for the relationship between the electrodes 1041 and 1042 with reference to FIG. 2, for example, all or a given combination of the electrodes 1071, 1072, 1073, . . . , and 1078 may have substantially the same dimension.

For example, distances from the reference line to the respective reference points of all or a given combination of the electrodes 1071, 1072, 1073, . . . , and 1078 are substantially the same. For example, a straight line from the reference line to the reference point of the electrode 1071 perpendicularly intersects the flat plate surface of the electrode 1071. The same applies to each of the electrodes 1072, 1073, . . . , and 1078.

The voltage/current control unit 12 controls the electric field surrounded by the electrodes 1071, 1072, 1073, . . . , and 1078 by applying a voltage to each of the electrodes 1071, 1072, 1073, . . . , and 1078. The electron beam 100 that has passed through the aperture of the second aperture member 105 passes through the region.

FIG. 3 shows a region 2000 which is an example of the region in a plane in parallel to the X direction and the Y direction within the region.

(3) Drawing Control Unit and Discharge Detection Control Unit

A case in which the discharge detection control unit 301 performs discharge detection processing will be described as an example.

FIG. 4 is a block diagram showing an example of configurations of the drawing control unit 11 and the discharge detection control unit 301 of the electron beam drawing apparatus 1 according to the first embodiment.

The drawing control unit 11 includes, for example, the beam path control unit 1101. The discharge detection control unit 301 includes, for example, a voltage data acquisition unit 3011 and a voltage data analysis unit 3012. Each of the drawing control unit 11 and the discharge detection control unit 301 realizes a processing function in each unit included in the control units themselves by causing a processor P to execute a program stored in a memory M. The processing function is not limited to the one realized by using a program stored in the memory M. The processing function may be realized by using, for example, a program provided through a network.

The storage unit 303 includes, for example, a voltage data storage unit 3031 and a discharge information storage unit 3032.

The voltage data storage unit 3031 stores voltage data items.

The discharge information storage unit 3032 stores information on a result of the discharge detection processing by the discharge detection control unit 301.

The beam path control unit 1101 performs processing of sending, to the voltage/current control unit 12, a control signal relating to control of a path of the electron beam 100, for example, while discharge detection processing is performed. Based on the control signal, the voltage/current control unit 12 controls the electric field and/or the magnetic field in the drawing unit 10, as described in the above.

The voltage data acquisition unit 3011 performs processing of sending a voltage data processing request to a given signal processing unit 302 while, for example, the electron beam 100 is being emitted with the electric field and/or the magnetic field controlled. In response to the voltage data processing request, as described in the above, the signal processing unit 302 generates a voltage data item and stores it in the voltage data storage unit 3031. The voltage data acquisition unit 3011 performs processing of reading out a voltage data item stored in the voltage data storage unit 3031.

The voltage data analysis unit 3012 performs processing of determining based on the voltage data item whether or not a discharge in the vicinity of an electrode corresponding to the voltage data item has been detected. More details of this processing will be described below. In the voltage data item, if a peak is observed in a potential of the electrode, and the magnitude of fluctuation in potential at this peak exceeds a threshold value, the voltage data analysis unit 3012 determines that a discharge has been detected. In the other cases, the voltage data analysis unit 3012 determines that no discharge has been detected. Alternatively, the voltage data analysis unit 3012 may perform this determination processing based on, for example, analysis of a high frequency component of the fluctuation in the potential. If it is determined that a discharge has been detected, the voltage data analysis unit 3012 may determine that a discharge has been detected, and the voltage data analysis unit 3012 may perform processing of determining a time correlated with a voltage at the peak relating to the determination, by using a relationship between a voltage indicated by the voltage data item and the time.

The voltage data analysis unit 3012 performs processing of causing the discharge information storage unit 3032 to store a result of the determination as to whether or not a discharge has been detected. If the voltage data acquisition unit 3011 reads out a plurality of voltage data items from the voltage data storage unit 3031, the voltage data analysis unit 3012 performs the same determination processing on each of the voltage data items and performs processing of causing the discharge information storage unit 3032 to store a result of the determination.

The voltage data analysis unit 3012 may make the above determination for each of the voltage data items respectively corresponding to two or more electrodes in substantially the same time period, and may perform the following processing if it is determined that a discharge in the vicinity of an electrode has been detected. The two or more electrodes are included in, for example, the same deflector; however, this is not a limitation. The voltage data analysis unit 3012 performs processing of identifying one of the two or more electrodes based on these voltage data items. Alternatively, the voltage data analysis unit 3012 may perform the identifying processing by using information for identifying the determined time for one or more voltage data items for which it is determined that a discharge has been detected. This identifying processing identifies an electrode closer or closest to a location that causes a discharge, such as an insulator. The voltage data analysis unit 3012 performs processing of causing the discharge information storage unit 3032 to store information for identifying the identified electrode.

The voltage data analysis unit 3012 may perform processing of estimating a position at which a discharge has occurred, based on the identified electrode. For example, there is an insulator in a voltage supply line (for example, a cable) from the voltage/current control unit 12 to the identified electrode, and it is estimated that a discharge has occurred in this insulator. Alternatively, an insulator is attached to the identified electrode, and it is estimated that a discharge has occurred in this insulator. Alternatively, in a space within a distance from the identified electrode, it is estimated that a discharge has occurred at a position closer to the identified electrode than any of the electrodes other than the two or more electrodes. This distance may be based on, for example, the threshold value. For example, the larger the threshold value, the smaller the distance. In a case where a peak of electrode potential is observed in a plurality of voltage data items among voltage data items respectively corresponding to the two or more electrodes, the estimation of a position may be as follows. For example, assuming that an electrode corresponding to a voltage data item having a larger peak is closer to a position at which a discharge has occurred, this position at which the discharge has occurred is estimated. In this way, a site relating to the specified electrode (hereinafter, also referred to as a site corresponding to the specified electrode) is detected as a site in which a discharge has occurred. The voltage data analysis unit 3012 performs processing of causing the discharge information storage unit 3032 to store information for identifying the estimated position.

Operation Example

The following will describe details of an operation in which a discharge is detected which is performed by the electron beam drawing apparatus 1. This operation is performed in, for example, a state (sensor mode) in which each electrode of the lighting deflector 104 is electrically connected to the signal processing unit 302A, each electrode of the projection deflector 107 is electrically connected to the signal processing unit 302B, and each electrode of the objective deflector 110 is electrically connected to the signal processing unit 302C. Hereinafter, a case in which each electrode is connected in this way will be described; however, the present embodiment is not limited to this.

(1) Flow of Entire Operation Relating to Discharge Detection Processing

FIG. 5 is a flowchart showing an example of the operation performed by the electron beam drawing apparatus 1 according to the first embodiment.

In step ST00, the discharge detection control unit 301 switches, for example, the connection destination of each electrode of the projection deflector 107 from the voltage/current control unit 12 to the signal processing unit 302B. Switching from a deflection mode to a sensor mode indicates, for example, switching of an electrical connection, and may be realized based on a control signal from the discharge detection control unit 301 as described with reference to FIG. 1. Switching of the connection destination of each electrode of the projection deflector 107 may be realized by physically switching wiring. The same applies to the following similar expressions. Similarly, the connection destination of each electrode of lighting deflector 104 is switched to the signal processing unit 302A, and the connection destination of each electrode of the objective deflector 110 is switched to the signal processing unit 302C.

In step ST01, the drawing control unit 11 controls a path of the electron beam 100 emitted from the electron gun 101 under the control of the beam path control unit 1101. More details of this processing will be described below. The drawing control unit 11 sends a control signal to the voltage/current control unit 12 under the control of the beam path control unit 1101. Based on this control signal, the voltage/current control unit 12 controls the electric field and/or the magnetic field in a region through which the electron beam 100 passes. The path of the electron beam 100 corresponds to the control over the electric field and/or the magnetic field. The drawing control unit 11 controls, for example, the electron beam 100 in such a manner as to travel straight from the electron gun 101 toward the stage ill side under the control of the beam path control unit 1101. Hereinafter, a case in which the electron beam 100 is controlled in such a manner as to travel straight in this way will be described as an example. Furthermore, processing relating to an electrode included in the projection deflector 107 will be described as an example of step ST02 and subsequent steps. However, instead of or in parallel with this processing, the same processing may be performed on the electrodes included in the lighting deflector 104 and/or the objective deflector 110.

In step ST02, the discharge detection control unit 301 acquires voltage data items respectively corresponding to the electrodes included in the projection deflector 107, for example, under the control of the voltage data acquisition unit 3011. More details of this processing will be described below. The discharge detection control unit 301 sends a voltage data processing request to, for example, the signal processing unit 302B under the control of the voltage data acquisition unit 3011 while the electron beam 100 is being emitted under the control described in the above. In response to the voltage data processing request, the signal processing unit 302B generates voltage data items respectively corresponding to the electrodes included in the projection deflector 107. The generated voltage data items are, for example, those in substantially the same time period. Each of the generated voltage data items indicates, for example, at least in part a relationship between a voltage and a time during a period in which the electron beam 100 is being emitted under the control described in the above. The discharge detection control unit 301 acquires the generated voltage data items under the control of the voltage data acquisition unit 3011. Not all of these voltage data items need to be acquired. The operation after step ST03 is performed while, for example, the electron beam 100 is being emitted under the control, but this is not always necessary.

In step ST03, the discharge detection control unit 301, under the control of the voltage data analysis unit 3012, makes a determination from each of the voltage data items respectively corresponding to the electrodes included in the projection deflector 107 in, for example, substantially the same time period, as to whether a discharge has been detected in the vicinity of an electrode corresponding to a voltage data item.

If it is not determined that a discharge has been detected in any of the voltage data items, the operation is terminated. However, if it is determined that a discharge has been detected in the vicinity of an electrode, the processing proceeds to step ST04.

In step ST04, based on these voltage data items, the discharge detection control unit 301 identifies, under the control of the voltage data analysis unit 3012, one of the electrodes included in the projection deflector 107, which is closest to a location causing a discharge. In this identifying processing, the following processing is performed. For example, if it is determined that a discharge has been detected in step ST03 from only one voltage data item, the discharge detection control unit 301 identifies an electrode corresponding to this voltage data item. For example, if it is determined that a discharge has been detected in step ST03 from two or more voltage data items, as will be described later, the discharge detection control unit 301 makes a comparison in height and/or timing of a peak relating to this determination between these voltage data items from which a determination that a discharge has been detected is made.

In step ST05, the discharge detection control unit 301 estimates a position at which a discharge has occurred, based on the identified electrode under the control of the voltage data analysis unit 3012, and then the operation is terminated. For example, there is an insulator in a voltage supply line from the voltage/current control unit 12 to the identified electrode, and it is estimated that a discharge has occurred in this insulator. Alternatively, an insulator is attached to the identified electrode, and it is estimated that a discharge has occurred in this insulator. Alternatively, in a space within a distance from the identified electrode, it is estimated that a discharge has occurred at a position closer to the identified electrode than any of the other electrodes included in the projection deflector 107. In this way, a site relating to the identified electrode is detected as a site in which a discharge has occurred.

In the above, processing relating to the electrodes included in the projection deflector 107 is described as an example of the operation after step ST02; however, the present embodiment is not limited to this example. As described in the above, in the operation after step ST02, the same processing may be performed on electrodes included in two or more deflectors. In this case, in step ST04, for example, among the electrodes included in the two or more deflectors, an electrode closest to a location causing a discharge is identified. In this case, in step ST05, for example, in a space within a distance from the identified electrode, it is estimated that a discharge has occurred at a position closer to the identified electrode than any of the other electrodes included in the two or more projection deflectors. Alternatively, in a case where a peak of electrode potential is observed in a plurality of voltage data items, the estimation may be as follows. In this case, in step ST05, it is assumed that an electrode corresponding to a voltage data item having a larger peak is closer to a position at which a discharge has occurred, and this position at which the discharge has occurred is estimated.

(2) Details of Beam Path Control Processing

Details of the beam path control processing in step ST01 of FIG. 5 will be described.

Figure 6:
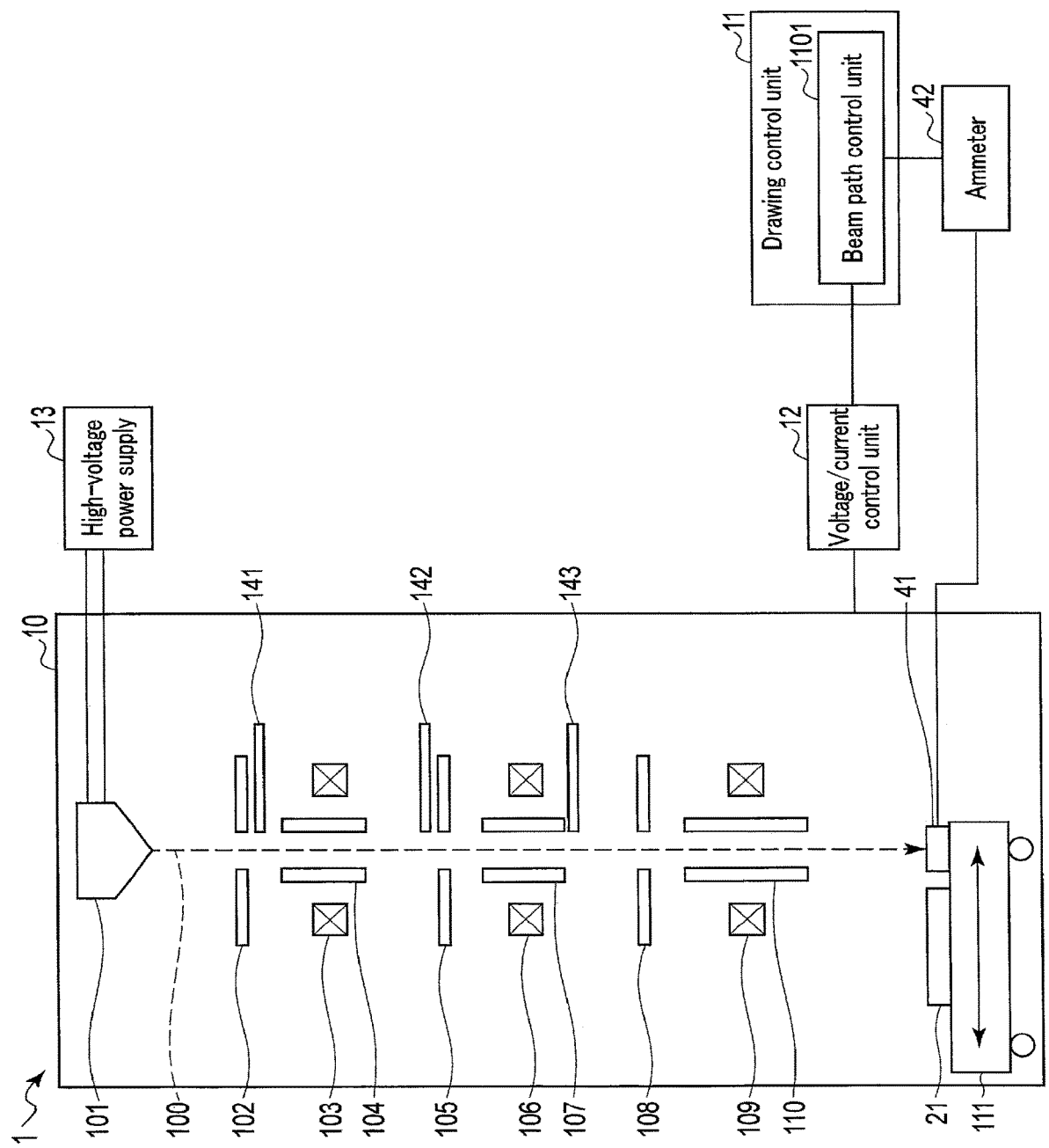
FIG. 6 is a diagram showing a state in which an electron beam is controlled in such a manner as to travel straight from an electron gun to a stage side in the electron beam drawing apparatus according to the first embodiment.

FIG. 6 is a diagram showing a state in which the electron beam 100 is controlled in such a manner as to travel straight from the electron gun 101 to the stage 111 side in the electron beam drawing apparatus 1 according to the first embodiment. By this control, the electron beam 100 heads toward the stage 111 through, for example, the aperture of the second aperture member 105 and the aperture of the third aperture member 108. In FIG. 6, the discharge detection unit 30 is not shown for ease of reference. The same applies to other similar figures after this figure.

In order for the electron beam 100 to travel straight in this way, the beam path control unit 1101 of the drawing control unit 11 causes the voltage/current control unit 12 to perform control to change the magnetic field by using, for example, at least one of the lighting coil 103, the projection coil 106, and the objective coil 109. In a case where any of the lighting deflector 104, the projection deflector 107, and the objective deflector 110 has an electrode electrically connected to the voltage/current control unit 12, the beam path control unit 1101 may cause the voltage/current control unit 12 to change the electric field by applying a voltage to the electrode. The beam path control unit 1101 causes the voltage/current control unit 12 to perform the control for changing the magnetic field and/or the control for changing the electric field in such a manner that the electron beam 100 travels straight as described in the above.

As shown in FIG. 6, the stage 111 is moved to a position at which the Faraday cup 41 is irradiated with the electron beam 100. The Faraday cup 41 captures electrons derived from the electron beam 100 with which the Faraday cup 41 is irradiated, and the ammeter 42 measures a current corresponding to the captured electrons. The ammeter 42, for example, sends a signal indicating the magnitude of the measured current to the beam path control unit 1101. The beam path control unit 1101 causes the voltage/current control unit 12 to finely adjust the path of the electron beam 100 using at least one of, for example, the lighting coil 103, the projection coil 106, and the objective coil 109 in such a manner as to maximize the magnitude of the current indicated by the signal.

This description describes a case in which, when the path of the electron beam 100 is controlled in this way, the electron beam 100 is referred to as being controlled by the beam path control unit 1101 in such a manner as to travel straight. However, the present embodiment is not limited to this. For example, fine adjustment of the path of the electron beam 100 using the Faraday cup 41 is not always necessary.

The above describes the case in which the beam path control unit 1101 finely adjusts the path of the electron beam 100 using at least one of the lighting coil 103, the projection coil 106, and the objective coil 109 based on the magnitude of a current detected using the Faraday cup 41. However, the present embodiment is not limited to this. The beam path control unit 1101 may finely adjust the path of the electron beam 100 using at least one of the lighting coil 103, the projection coil 106, and the objective coil 109 based on some other index.

(3) Details of Voltage Data Analysis Processing

Details of the voltage data analysis processing in step ST03 and step ST04 of FIG. 5 will be described.

Figure 7:
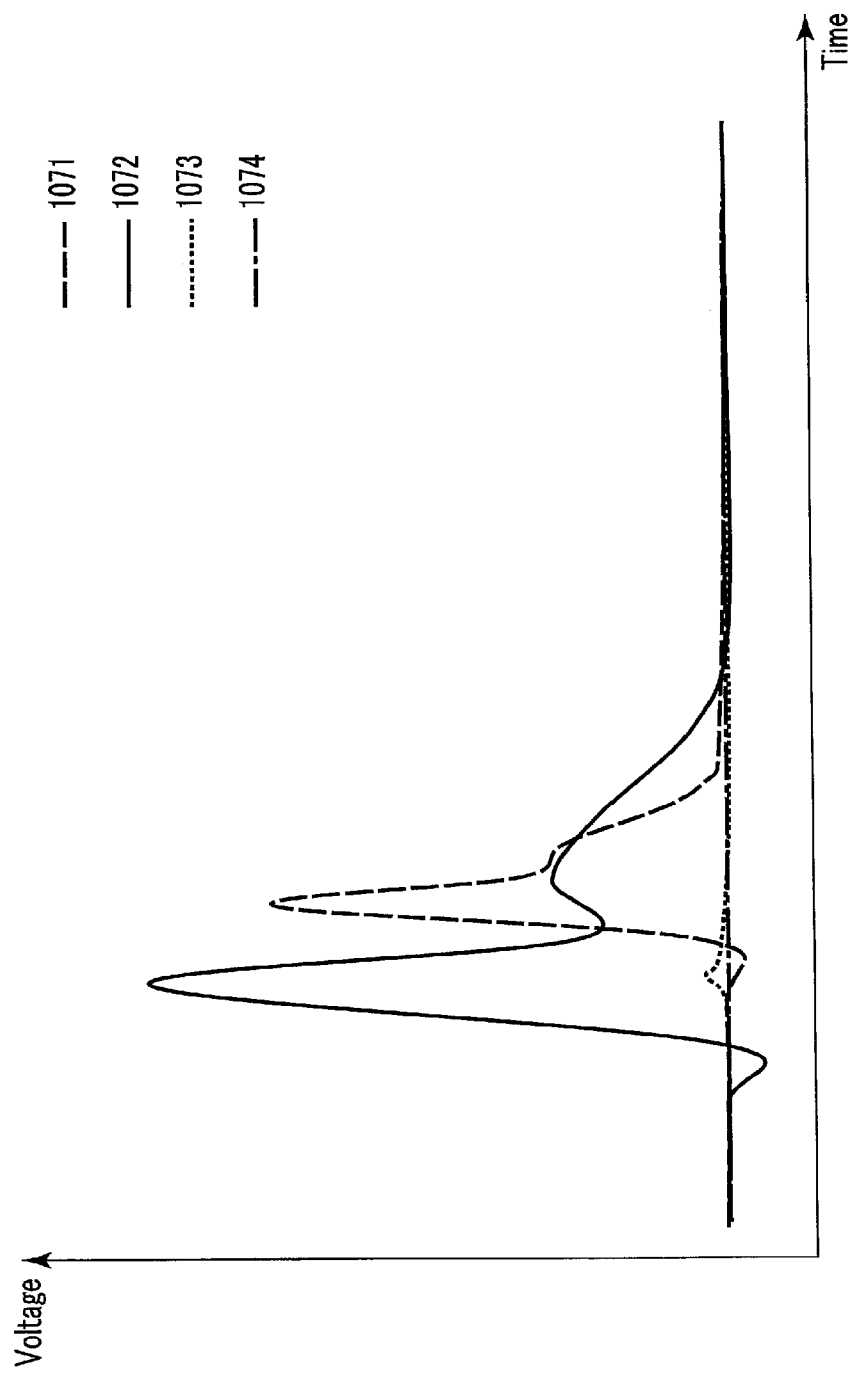
FIG. 7 is a diagram showing an example of graphs obtained by plotting a plurality of voltage data items, respectively.

FIG. 7 shows an example of graphs obtained by plotting a plurality of voltage data items in substantially the same time period, respectively. The plurality of voltage data items respectively corresponds to, for example, the electrodes 1071, 1072, 1073, and 1074 of the projection deflector 107. In each graph, the horizontal axis corresponds to time and the vertical axis corresponds to a potential of an electrode corresponding to a plotted voltage data item. In the example of FIG. 7, for ease of reference, a graph is shown for each of the four electrodes, not all of the electrodes of the projection deflector 107. The following will describe an example of the case in which the voltage data analysis processing in step ST03 and step ST04 shown in FIG. 5 is performed on these electrodes of the projection deflector 107; however, similar processing may be performed on all of the electrodes of the projection deflector 107. Similar processing may be performed on the lighting deflector 104 and/or the objective deflector 110 in place of or in addition to the projection deflector 107.

In the graphs shown in FIG. 7, for example, in each of the electrodes 1071 and 1072, the magnitude of fluctuation in potential may exceed a threshold value. For example, the magnitude of fluctuation from a potential before its peak to a potential that has reached its peak exceeds the threshold value. On the other hand, in both the electrode 1073 and 1074, the magnitude of fluctuation in potential does not exceed a threshold value. Therefore, in step ST03, it is determined for each of the electrodes 1071 and 1072 that a discharge in the vicinity of each of these electrodes has been detected, and it is determined for each of the electrodes 1073 and 1074 that a discharge in the vicinity of each of these electrodes has not been detected.

It is considered that the reason why the determination is made in this way is that the electrodes 1071 and 1072 are closer to a location causing a discharge than any of the electrodes 1073 and 1074. Furthermore, a peak of the electrode 1072 is higher than a peak of the electrode 1071, and a timing of the peak of the electrode 1072 is earlier than a timing of the peak of the electrode 1071. It is considered that this is because the electrode 1072 is closer to a location causing a discharge than the electrode 1071. Therefore, in step ST04, for example, the electrode 1072 corresponding to a voltage data item exhibiting the highest potential peak is identified among the voltage data items from which it is determined that a discharge has been detected. Alternatively, the electrode 1072 corresponding to, for example, a voltage data item exhibiting the earliest potential peak among such voltage data items may be identified.

For example, with the electron beam drawing apparatus 1 from which the identified electrode 1072 has been removed, the operation described with reference to FIG. 5 may be executed again. In this case, if it is determined that no discharge has been detected in the vicinity of an electrode other than the electrode 1072 (for example, the electrode 1071) for which it is determined that a discharge in the vicinity has been detected, the fact that an environment in which scattered electrons are likely to collect on the identified electrode has occurred can be confirmed. Such an environment may occur, for example, if an insulator that causes a discharge is attached to the identified electrode itself. Such a confirmation may be performed, for example, for a given voltage data item for which it is determined that a discharge has been detected, after removing the electrode corresponding to the voltage data item.

Advantageous Effects

In the electron beam drawing apparatus 1 according to the first embodiment, for example, each electrode of the lighting deflector 104 is electrically connected to the signal processing unit 302A, each electrode of the projection deflector 107 is electrically connected to the signal processing unit 302B, and each electrode of the objective deflector 110 is electrically connected to the signal processing unit 302C. Each of the signal processing units 302A-C generates a plurality of voltage data items respectively corresponding to the electrodes connected to the signal processing units. Based on these voltage data items, the electron beam drawing apparatus 1 can detect a discharge occurring in the vicinity of each of the electrodes of the lighting deflector 104, the projection deflector 107, and the objective deflector 110. Detected discharges include a discharge which cannot be detected with a current detector conventionally provided in the electron beam drawing apparatus 1 (this current detector is also referred to as an intermediate detector in order to distinguish it from the Faraday cup 41 which also serves as a current detector). The number of discharge detection points of the electron beam drawing apparatus 1 is significantly increased. Therefore, the electron beam drawing apparatus 1 enables more discharges to be detected in the apparatus and a location causing a discharge to be estimated in a wider area. In a case of detecting a discharge from a voltage data item, as a threshold value for use in discharge detection processing is set larger, the electron beam drawing apparatus 1 can detect a discharge occurring in the area closer to an electrode corresponding to the voltage item and/or a discharge which is more likely to lead to a drawing pattern error if the discharge occurs during drawing, for example. Furthermore, it can be learned that the electrode itself corresponding to a voltage data item for which it is determined that a discharge has been detected was the cause of the discharge.

Based on voltage data items respectively corresponding to two or more electrodes in, for example, substantially the same time period, the electron beam drawing apparatus 1 may identify the electrode that is closer or closest to a location causing a discharge out of the two or more electrodes. The two or more electrodes are included in, for example, the same deflector. The electron beam drawing apparatus 1 may estimate a position in which a discharge has occurred based on the identified electrode. As described in the above, the electron beam drawing apparatus 1 enables a region estimated to be the cause of the discharge to be further narrowed. Furthermore, it can be learned that the identified electrode itself was the cause of the discharge.

Discharge detection processing such as that described in the above is performed while, for example, the electron beam 100 is controlled in such a manner as to travel straight from the electron gun 101 toward the stage 111. In this case, the electron beam 100 passes between the two electrodes 1041 and 1042 of the lighting deflector 104, passes through the region surrounded by the eight electrodes 1071, 1072, . . . , and 1078 of the projection deflector 107, and further passes through the region surrounded by, for example, eight electrodes of the objective deflector 110. If a location causing a discharge is present in the vicinity of whichever one of these electrodes, scattered electrons of the electron beam 100 may gather at the location to cause a discharge. Such a discharge is detected in the discharge detection processing. Therefore, the electron beam drawing apparatus enables, if a location causing a discharge is present in the vicinity of whichever one of these electrodes, the presence of the location to be captured reliably through the discharge detection processing.

[Modifications]

Other operations in which the discharge is detected, which are executed by the electron beam drawing apparatus 1, will be described below. Each modification will be described focusing on the differences from the configuration example, operation example, and advantageous effects described in the above.

(1) First Modification

In the electron beam drawing apparatus 1 according to a first modification of the first embodiment, in the beam path control processing in step ST01 of FIG. 5, the path of the electron beam 100 is controlled, as will be described below.

Figure 8:
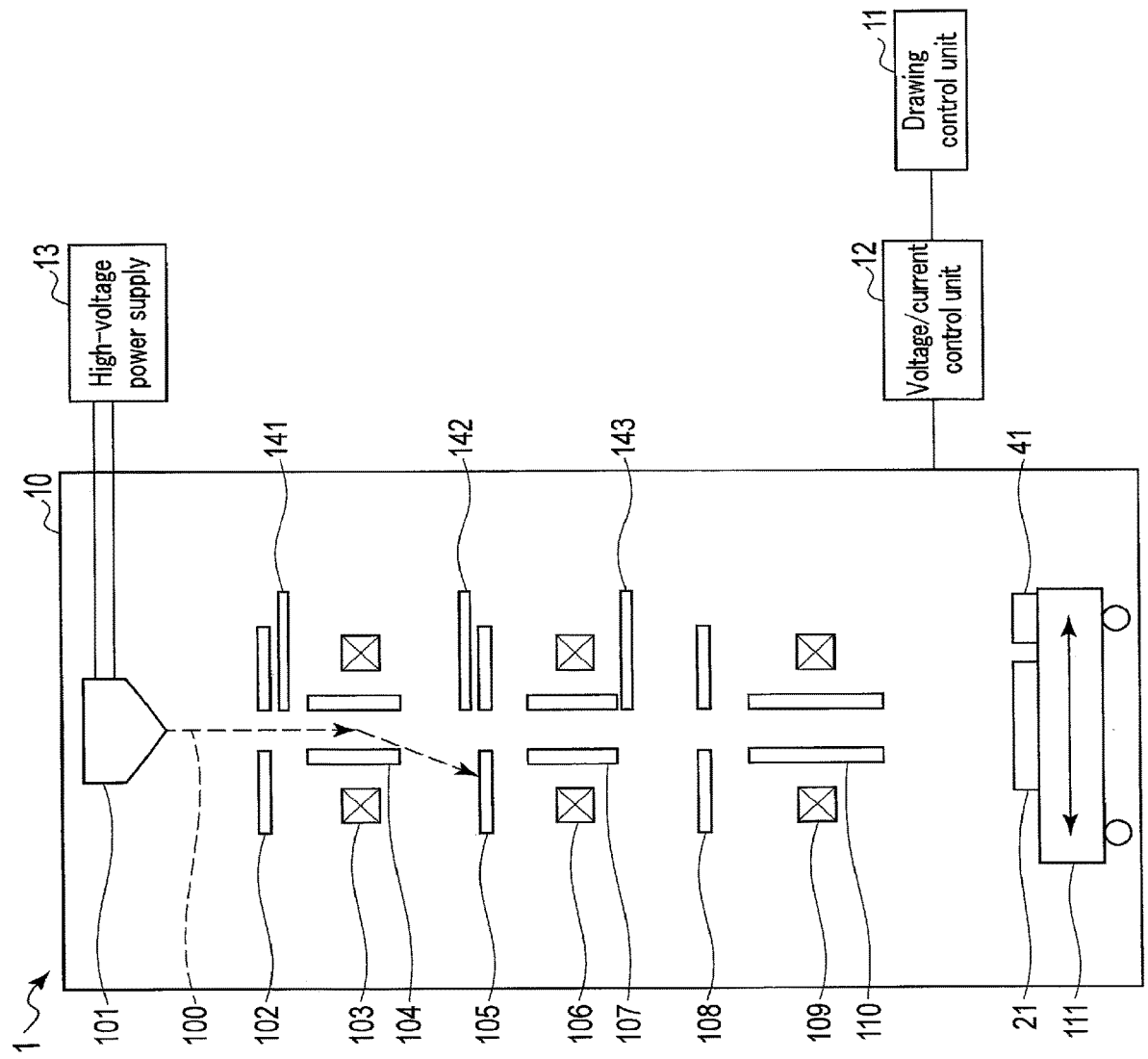
FIG. 8 is a diagram showing a state in which an electron beam is controlled in such a manner as to be irradiated to a position different from an aperture of a second aperture member in the electron beam drawing apparatus according to a first modification of the first embodiment.

FIG. 8 is a diagram showing a state in which the electron beam 100 is controlled in such a manner as to be emitted to a position different from the aperture of the second aperture member 105 in the electron beam drawing apparatus 1 according to the first modification of the first embodiment.

The beam path control unit 1101 of the drawing control unit 11 causes the voltage/current control unit 12 to change the magnetic field by using, for example, the lighting coil 103 in such a manner that such a position is irradiated with the electron beam 100. Not all parts of the electron beam 100 need to be irradiated to a position different from the aperture of the second aperture member 105, and a part of the electron beam 100 may pass through the aperture of the second aperture member 105. In a case where the lighting deflector 104 contains an electrode electrically connected to the voltage/current control unit 12, the beam path control unit 1101 causes the voltage/current control unit 12 to change the magnetic field by applying a voltage to this electrode. The beam path control unit 1101 causes the voltage/current control unit 12 to perform the control for changing the magnetic field and/or the control for changing the electric field in such a manner that the electron beam 100 is emitted as described in the above.

In step ST02 and subsequent steps, for example, among the electrodes included in the lighting deflector 104 and/or the projection deflector 107, processing is performed on the electrodes electrically connected to one of the signal processing units 302, and the voltage data items corresponding to these electrodes.

Generally, the electron beam drawing apparatus 1 is in a beam OFF state for a much longer time than it is in a beam ON state from the start to the completion of drawing on the sample 21. In the beam OFF state, a position different from the aperture of the second aperture member 105 is irradiated with the electron beam 100 and the electron beam 100 does not pass through the aperture. For example, scattered electrons are collected at a location which will cause a discharge while the electron beam drawing apparatus 1 is in the beam OFF state, and the collected scattered electrons generate a discharge to cause a drawing pattern error while the electron beam drawing apparatus 1 is in the beam ON state. The electron beam drawing apparatus 1 according to the first modification of the first embodiment performs discharge detection processing while controlling the electron beam 100 to be applied to a position different from the aperture of the second aperture member 105. That is, the discharge detection processing is performed while the electron beam 100 is emitted in the same manner as in the beam OFF state. Therefore, the electron beam drawing apparatus 1 according to the first modification of the first embodiment enables detection of a discharge which occurs at a location which is particularly likely to cause a discharge when drawing is performed on the sample 21.

(2) Second Modification

In the electron beam drawing apparatus 1 according to a second modification of the first embodiment, in the beam path control processing in step ST01 of FIG. 5, the path of the electron beam 100 is controlled as will be described below.

Figure 9:
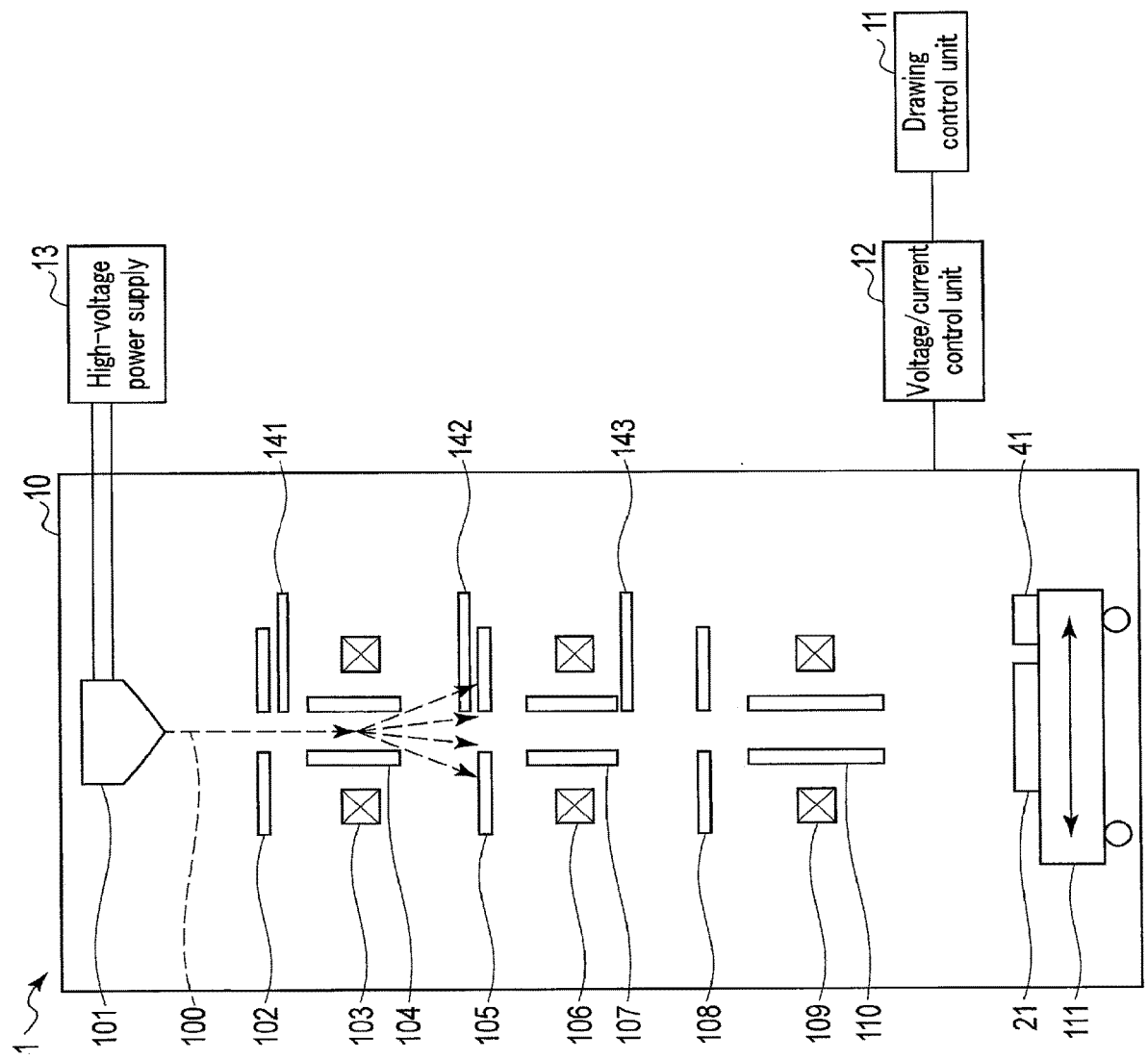
FIG. 9 is a diagram showing a state in which an electron beam is controlled in such a manner as to be deflected in various directions by a lighting coil in the electron beam drawing apparatus according to a second modification of the first embodiment.

FIG. 9 is a diagram showing a state in which the electron beam 100 is controlled in such a manner as to be deflected in various directions by the lighting coil 103 in the electron beam drawing apparatus 1 according to the second modification of the first embodiment. In this control, the electron beam 100 may be deflected in any direction for any time period. In this control, the electron beam 100 may be deflected more than the electron beam 100 deflected by the lighting coil 103 and the lighting deflector 104 when drawing is performed on the sample 21. In this control, the electron beam 100 may be deflected in a direction other than the direction in which the electron beam 100 is deflected by the lighting coil 103 and the lighting deflector 104 when drawing is performed on the sample 21.

The following will describe, as an example, the case in which the electron beam 100 is controlled in this way; however, the same applies to the case in which the electron beam 100 is controlled in such a manner as to be deflected in various directions by the projection coil 106 or the objective coil 109.

The beam path control unit 1101 of the drawing control unit 11 causes the voltage/current control unit 12 to change the magnetic field by using, for example, the lighting coil 103 in such a manner that the electron beam 100 is deflected in this way. In a case where the lighting deflector 104 contains an electrode electrically connected to the voltage/current control unit 12, the beam path control unit 1101 causes the voltage/current control unit 12 to change the magnetic field by applying a voltage to this electrode. The beam path control unit 1101 causes the voltage/current control unit 12 to perform the control for changing the magnetic field and/or the control for changing the electric field in such a manner that the electron beam 100 is deflected as described in the above.

In step ST02 and subsequent steps, for example, among the electrodes included in the lighting deflector 104 and/or the projection deflector 107, processing is performed on the electrodes electrically connected to one of the signal processing units 302, and on the voltage data items corresponding to these electrodes.

The electron beam drawing apparatus 1 according to the second modification of the first embodiment performs discharge detection processing while controlling the electron beam 100 to be deflected in various directions. By the electron beam 100 being deflected in various directions, electrons are scattered over a wide range in the electron beam drawing apparatus 1. Therefore, the electron beam drawing apparatus 1 according to the second modification of the first embodiment enables detection of a discharge occurring at a location causing the discharge in a wider range.

As described in the above, each of the first modification and the second modification describe another example of the beam path control processing in step ST01 of FIG. 5. The electron beam drawing apparatus 1 may perform an operation to be performed by freely combining some examples of the beam path control processing disclosed in this description. For example, in step ST03 of FIG. 5, if it is not determined that a discharge has been detected in any of the voltage data items, the operation is not terminated but returns to step ST01. The beam path control processing that is performed after returning to step ST01 performs different control from that in the beam path control processing performed before returning to step ST01. For example, in the first step ST01, if the electron beam 100 is controlled in such a manner as to travel straight from the electron gun 101 to the stage 111 side, in the next step ST01, the electron beam 100 may be controlled in such a manner as to be deflected in various directions by the lighting coil 103, etc.

While detecting a discharge, as in the first modification, a part of the electron beam 100 may pass through the aperture of the second aperture member 105 and the remaining part may be shielded by the second aperture member 105. Furthermore, in the second modification, a part of the electron beam 100 may pass through the aperture of the third aperture member 108, and the remaining part may be shielded by the third aperture member 108.

(3) Third Modification

Figure 10:
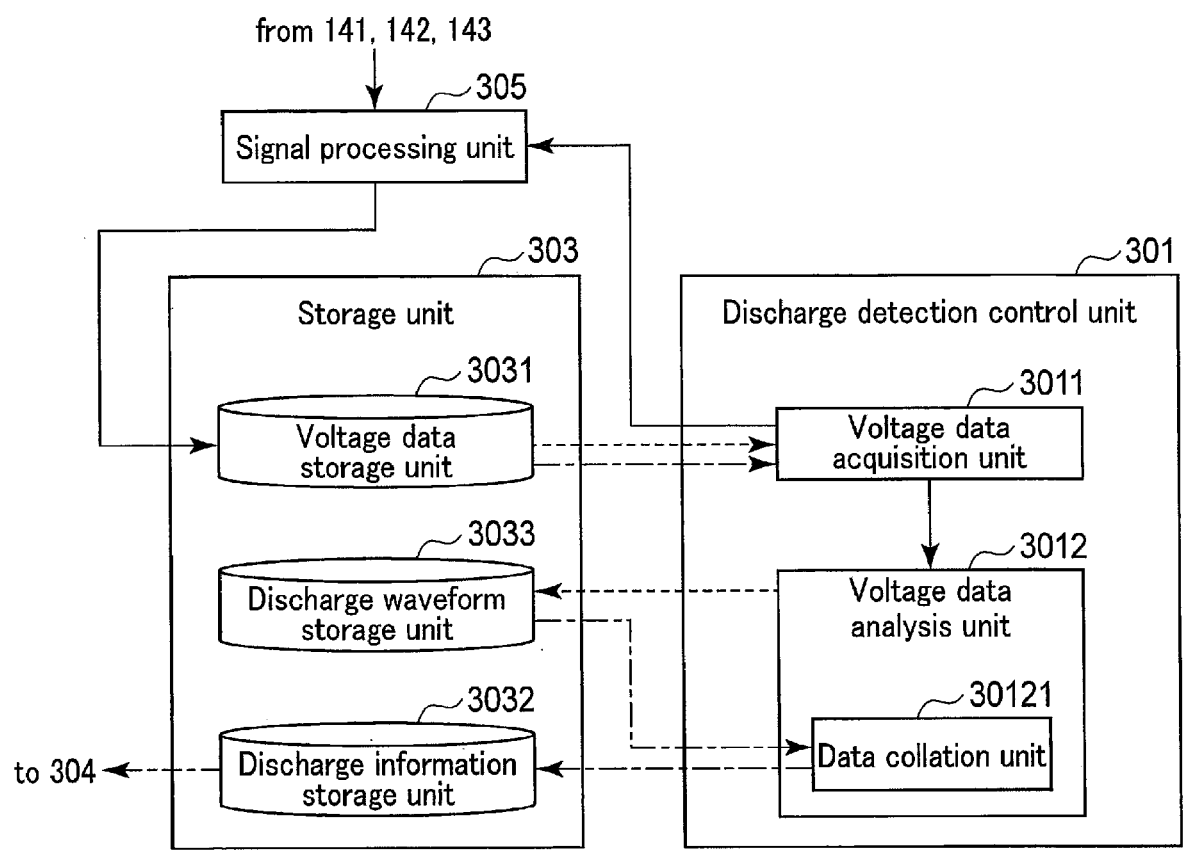
FIG. 10 is a block diagram showing an example of a configuration of a discharge detection control unit of an electron beam drawing apparatus according to a third modification of the first embodiment.

FIG. 10 is a block diagram showing an example of a configuration of the discharge detection control unit 301 of the electron beam drawing apparatus 1 according to a third modification of the first embodiment.

As already illustrated in FIG. 1, the discharge detection unit 30 includes the signal processing unit 305. Each of the current detectors 141, 142, and 143 is electrically connected to the signal processing unit 305.

The signal processing unit 305 converts a current from the current detector 141 into a voltage using an I/V amplifier (not shown), and measures this voltage (voltage data item). By this, the signal processing unit 305 acquires a current from the current detector 141 by measuring a voltage (voltage data item) corresponding to the current. Alternatively, by measuring a voltage generated in the input impedance (resistance) of the above I/V amplifier from the side (in parallel connection) by using an oscilloscope, the voltage (voltage data item) corresponding to the current from the current detector 141 is measured. The signal processing unit 305 also measures a voltage (voltage data item) corresponding to a current from the current detectors 142 and 143 in a similar manner. As described in the above, the voltage data item from the signal processing unit 305 corresponds to a current value from the current detector. The signal processing unit 305 generates voltage data items respectively corresponding to the current detectors 141, 142, and 143, and stores them in the storage unit 303.

For example, the voltage data item corresponding to the current detector 141 represents a relationship between a potential and time according to a current detected by the current detector 141. The same applies to the voltage data items respectively corresponding to the current detectors 142 and 143. Regarding voltage data items respectively generated by the various signal processing units, in order to enable a determination as to whether or not these voltage data items are those in substantially the same time period, for example, clocks respectively used by the signal processing unit 305 and the signal processing units 302A, 302B, and 302C may be the same or may be configured to be synchronous with each other.

The voltage data acquisition unit 3011 performs processing of sending a voltage data processing request to a given signal processing unit 302 and processing of sending a voltage data processing request to the signal processing unit 305, as described with reference to FIG. 4, for example. In response to the voltage data processing request, the signal processing unit 305 generates the voltage data items respectively corresponding to the current detectors 141, 142, and 143, and stores them in the voltage data storage unit 3031. The voltage data items generated by the signal processing units 302 and 305, in response to these voltage data processing requests are, for example, those in substantially the same time period.

As described with reference to FIG. 4, based on, for example, a plurality of voltage data items generated by the signal processing unit 302 and stored in the voltage data storage unit 3031, the voltage data analysis unit 3012 performs processing of detecting a discharge and processing of identifying an electrode close to a location causing the discharge. Furthermore, as described with reference to FIG. 4, the voltage data analysis unit 3012 may perform processing of estimating a position in which a discharge has occurred, based on the identified electrode.

The voltage data acquisition unit 3011 performs processing of reading out voltage data items respectively corresponding to the current detectors 141, 142, and 143 stored in the voltage data storage unit 3031. The voltage data analysis unit 3012 performs processing of determining whether or not a waveform of a relationship between a potential and time indicated by the voltage data item corresponding to the current detector 141 (hereinafter, also referred to as a waveform of the voltage data item) captures some waveform caused by the discharge. For example, even if a peak is observed in a potential of the current detector 141 in the voltage data item but the magnitude of fluctuation in the potential at the peak does not exceed the threshold, it may be determined that some waveform caused by the discharge is captured in the voltage data item. If it is determined that some waveform caused by the discharge is captured, the voltage data analysis unit 3012 performs processing of causing a discharge waveform storage unit 3033 of the storage unit 303 to store the voltage data item in such a manner as to correlate it with a discharge in the vicinity of the identified electrode. For the sake of brevity, the following will describe such a correlation assuming that the voltage data item and the electrode are correlated with each other. The voltage data analysis unit 3012 performs similar processing on the voltage data items respectively corresponding to the current detectors 142 and 143. The following description assumes that a voltage data item and a discharge in the vicinity of an identified electrode are correlated with each other; however, the present embodiment is not limited to this. For example, if a position at which a discharge has occurred is already estimated, the voltage data analysis unit 3012 may perform processing of causing the discharge waveform storage unit 3033 to store a voltage data item in such a manner that it is correlated with a discharge occurring at the estimated position.

As a result of the above processing repeated, the discharge waveform storage unit 3033 stores, for, e.g., electrodes of the lighting deflector 104, the projection deflector 107, and the objective deflector 110, voltage data items which are respectively correlated with these electrodes and respectively correspond to the current detectors 141, 142, and 143 (hereinafter, also referred to as discharge waveform data items). As a discharge waveform data item associated with an electrode, it is not always necessary to store all of the discharge waveform data items respectively corresponding to the current detectors 141, 142, and 143. Furthermore, there may be a case in which no discharge waveform data item correlated with an electrode is stored. Furthermore, a plurality of discharge waveform data items which correspond to a current detector and are correlated with an electrode may be stored.

The processing of storing discharge waveform data items in the discharge waveform storage unit 3033 may be performed in the case where it is determined that a discharge has been detected in the vicinity of an electrode as described with reference to FIG. 4 and/or the case where it is confirmed that an environment in which scattered electrons are likely to collect on an electrode has occurred as described with reference to FIG. 7, instead of or in addition to the case where the processing of identifying an electrode is performed.

As described in the above, after discharge waveform data items are stored in the discharge waveform storage unit 3033, the discharge detection control unit 301 performs processing to be described next. The processing described next can be performed during drawing on the sample 21.

The voltage data acquisition unit 3011 performs processing of sending a voltage data processing request to the signal processing unit 305. In response to the voltage data processing request, the signal processing unit 305 generates the voltage data items respectively corresponding to the current detectors 141, 142, and 143 (hereinafter, referred to as an examination target voltage data item) and stores them in the voltage data storage unit 3031. The voltage data acquisition unit 3011 performs processing of reading out an examination target voltage data item stored in the voltage data storage unit 3031 and correlated with a current detector.

The voltage data analysis unit 3012 includes a data collation unit 30121.

The data collation unit 30121 performs processing of reading out a discharge waveform data item stored in the discharge waveform storage unit 3033 and correlated with the current detector. The data collation unit 30121 performs processing of determining whether or not a waveform of the examination target voltage data item is similar to a waveform of the discharge waveform data item. If it is determined that a waveform of the examination target voltage data item is similar to a waveform of the discharge waveform data item, the data collation unit 30121 performs processing of determining that a discharge in the vicinity of an electrode correlated to the discharge waveform data item is detected. The data collation unit 30121 performs processing of storing a result of this determination in, for example, the discharge information storage unit 3032. If one or more other discharge waveform data items correlated with the current detector are stored in the discharge waveform storage unit 3033, the data collation unit 30121 performs similar processing on one or more other discharge waveform data items mentioned in the above. The data collation unit 30121 performs similar processing on examination target voltage data items respectively corresponding to other current detectors. A result of such a determination stored in the discharge information storage unit 3032 is displayed on the monitor 304, for example.

Next, the following will describe details of the operation of detecting, which is performed by the electron beam drawing apparatus 1 according to a third modification of the first embodiment, a discharge occurring in the vicinity of one of the electrodes of the lighting deflector 104, the projection deflector 107, and the objective deflector 110 during drawing on the sample 21, for example.

Figure 11:
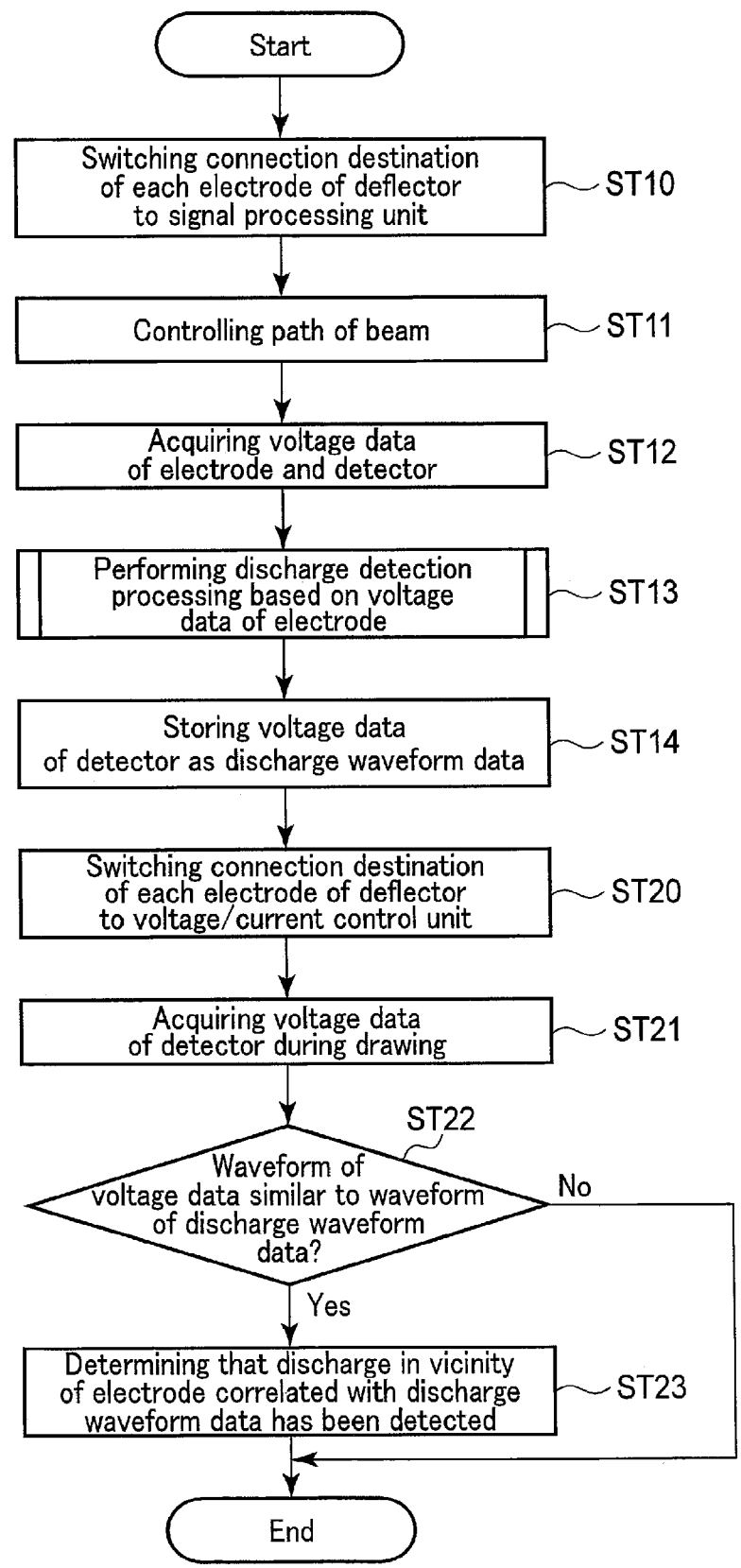
FIG. 11 is a flowchart showing an example of an operation in which a discharge is detected and which is executed by the electron beam drawing apparatus according to the third modification of the first embodiment.

FIG. 11 is a flowchart showing an example of the operation performed by the electron beam drawing apparatus 1 according to the third modification of the first embodiment.

Step ST10 is similar to step ST00 of FIG. 5, and step ST11 is similar to step ST01 of FIG. 5.

In step ST12, the discharge detection control unit 301 performs the processing described with reference to step ST02 of FIG. 5 and also acquires voltage data items respectively corresponding to the current detector 141, 142, and 143 under the control of the voltage data acquisition unit 3011. More details of this processing will be described below. The discharge detection control unit 301 sends a voltage data processing request to, for example, the signal processing unit 302B and also sends a voltage data processing request to the signal processing unit 305 under the control of the voltage data acquisition unit 3011 while the electron beam 100 is being emitted under the control of the voltage data acquisition unit 3011. In response to the voltage data processing request, the signal processing unit 305 generates voltage data items respectively corresponding to the current detectors 141, 142, and 143. The voltage data items generated by the signal processing units 302B and 305 in response to these voltage data processing requests are, for example, those in substantially the same time period. The discharge detection control unit 301 acquires voltage data items respectively corresponding to the electrodes included in the projection deflector 107 and voltage data items respectively corresponding to the current detectors 141, 142, and 143 under the control of the control unit 11. Not all of these voltage data items respectively corresponding to the current detectors 141, 142, and 143 need to be acquired.

In step ST13, the discharge detection control unit 301 performs discharge detection processing based on the voltage data items respectively corresponding to the electrodes contained in the projection deflector 107 under the control of the voltage data analysis unit 3012. In this discharge detection processing, for example, the operation described with reference to steps ST03 and ST04 of FIG. 5 is described; however, the operation described with reference to step ST04 is not necessarily performed. For example, among the electrodes included in the projection deflector 107, an electrode 1072 closest to a location causing a discharge is identified.

In step ST14, the discharge detection control unit 301 causes the discharge waveform storage unit 3033 to store a discharge waveform data item under the control of the voltage data analysis unit 3012. More details of this processing will be described below. The discharge detection control unit 301 determines whether or not a waveform of a voltage data item corresponding to, for example, the current detector 141 captures some waveform caused by the discharge under the control of the voltage data analysis unit 3012. If it is determined that some waveform caused by the discharge is captured under the control of the voltage data analysis unit 3012, the discharge detection control unit 301 causes the discharge waveform storage unit 3033 to store the voltage data item as a discharge waveform data item in such a manner that the voltage data item is correlated with the identified electrode 1072. Similar processing is performed on the voltage data items respectively corresponding to the current detectors 142 and 143.

The operation from step ST11 to step ST14 is repeated a given number of times, so that the discharge waveform storage unit 3033 stores, for, e.g., electrodes of the lighting deflector 104, the projection deflector 107, and the objective deflector 110, and voltage data items which are respectively correlated with these electrodes and respectively correspond to the current detectors 141, 142, and 143 (hereinafter, also referred to as discharge waveform data items).

As described in the above, after the discharge waveform data items are stored in the discharge waveform storage unit 3033, the operation after step ST20 will be performed.

In step ST20, the discharge detection control unit 301 switches, for example, the connection destination of each electrode of the projection deflector 107 from the signal processing unit 302B to the voltage/current control unit 12. Similarly, the connection destination of each electrode of lighting deflector 104 and the objective deflector 110 is switched to the voltage/current control unit 12.

In step ST21, the discharge detection control unit 301 acquires examination target voltage data items respectively corresponding to the current detectors 141, 142, and 143 during drawing on, for example, the sample 21 under the control of the voltage data acquisition unit 3011. Each of the acquired examination target voltage data items indicates, for example, a relationship between a voltage and time during a period in which drawing is performed on, for example, the sample 21. Not all of these examination target voltage data items respectively corresponding to the current detectors 141, 142, and 143 need to be acquired. The operation after step ST22 is performed while, for example, drawing is being performed on the sample 21 under the control; however, this is not always necessary.

In step ST22, the discharge detection control unit 301 determines whether or not a waveform of an examination target voltage data item is similar to a waveform of a discharge waveform data item under the control of the data collation unit 30121. More details of this processing will be described below. Under the control of the data collation unit 30121, the discharge detection control unit 301 reads out a discharge waveform data item corresponding to, for example, the current detector 141 stored in the discharge waveform storage unit 3033. The discharge waveform data item is correlated with, for example, the electrode 1072. The discharge detection control unit 301 determines whether or not a waveform of an examination target voltage data item corresponding to the current detector 141 is similar to a waveform of a discharge waveform data item under the control of the data collation unit 30121. Similar processing is performed on each of the combinations of the examination target voltage data item and each of the discharge waveform data items corresponding to the current detector 141 and stored in the discharge waveform storage unit 3033. Similar processing is performed on the voltage data items respectively corresponding to the current detectors 142 and 143.

If it is determined that a waveform of an examination target voltage data item is similar to a waveform of a discharge waveform data item, the operation proceeds to step ST23. Otherwise, the operation is terminated.

The following will describe, for example, a case in which a determination made in step ST22 is that a waveform of an examination target voltage data item corresponding to the current detector 143 is similar to a waveform of a discharge waveform data item corresponding to the current detector 143 and correlated with the electrode 1072. In this case, the discharge detection control unit 301 determines in step ST23 that a discharge has been detected in the vicinity of the electrode 1072 under the control of the data collation unit 30121.

For example, at the time of measurement before drawing by the drawing apparatus, in step ST12, a discharge detected in each of the electrodes of the deflectors and current waveform data of each of the current detectors 141 to 143 at the time of detecting the discharge are stored in such a manner that the discharge and the current waveform data are correlated with each other. During drawing by the drawing apparatus, even if each electrode of each deflector cannot be used as a discharge detector, a discharge can be detected by each of the current detectors 141 to 143.

The above describes the case of using a discharge waveform data item correlated with an electrode; however, the present embodiment is not limited to this case. Each of the discharge waveform data items may be correlated with a discharge occurring at a position estimated before. In this case, in step ST13, the operation described in step ST05 of FIG. 5 is performed, and in step ST23 it is determined that a discharge occurring at a position estimated before has been detected.

The electron beam drawing apparatus 1 according to a third modification of the first embodiment detects a discharge in the vicinity of an electrode contained in the lighting deflector 104, the projection deflector 107, and the objective deflector 110 by performing the discharge detection processing described before and in the second modification, and also performs the following processing. That is, a voltage data item capturing some waveform caused by the discharge and corresponding to one of the current detectors 141, 142, and 143 is correlated with the electrode and is then stored as a discharge waveform data item. By repeating the above processing, a discharge waveform data item in the case of a discharge occurring in the vicinity of the electrode is prepared for each of the electrodes of the lighting deflector 104, the projection deflector 107, and the objective deflector 110, for example. Thereafter, the electron beam drawing apparatus 1 according to the third modification of the first embodiment detects a discharge, as will be described below. For example, during drawing on the sample 21, the electron beam, drawing apparatus 1 acquires an examination target voltage data item corresponding to a current detector among the current detectors 141, 142, and 143. If it is determined that a waveform of the examination target voltage data item is similar to some waveform of the discharge waveform data item, the electron beam drawing apparatus 1 determines that a discharge occurring in the vicinity of an electrode corresponding to the discharge waveform data item has been detected.

In this manner, the electron beam drawing apparatus 1 according to the third modification of the first embodiment can detect a discharge occurring in the vicinity of each of the electrodes of the lighting deflector 104, the projection deflector 107, and the objective deflector 110, by using the current detectors 141, 142, and 143. The electron beam drawing apparatus 1 can acquire a voltage data item of each of the current detectors 141, 142, and 143 even while deflecting the electron beam 100 by using the lighting deflector 104, the projection deflector 107, and the objective deflector 110. For this reason, the electron beam drawing apparatus 1 according to the third modification of the first embodiment enables a discharge occurring in the vicinity of each of the electrodes of the lighting deflector 104, the projection deflector 107, and the objective deflector 110 to be detected even when drawing is being performed on the sample 21, for example.

(4) Fourth Modification

Among the electrodes included in the lighting deflector 104, the projection deflector 107, and the objective deflector 110, the following description focuses on an electrode. The voltage/current control unit 12 is electrically connected to the electrode via a voltage supply line and applies a voltage to this electrode. On the other hand, a signal processing unit 302 is electrically connected to the electrode and acquires information relating to a potential of this electrode. Regarding an electrical connection with the electrode, a description relating to an output impedance of the voltage/current control unit 12 and an input impedance of the signal processing unit 302 will be given below.

The input impedance of the signal processing unit 302 is, for example, adjustable. For example, the signal processing unit 302 is configured in such a manner that an input impedance can be adjusted between some values beforehand. The input impedance is made substantially the same as an output impedance of the voltage/current control unit 12, for example. An output impedance of the voltage/current control unit 12 is, for example, an output impedance of a digital/analog conversion amplifier (DAC amplifier) contained in the voltage/current control unit 12, for example.

The following will also describe the case in which the signal processing unit 302 is not configured in such a manner that the input impedance can be adjusted by the signal processing unit 302 itself. Electrical connection between the signal processing unit 302 and the electrode is made via a termination resistor in the signal processing unit 302 side. The combination of the signal processing unit 302 and the termination resistor can be regarded as one signal processing unit whose input impedance corresponds to an impedance obtained by combining the input impedance of the signal processing unit 302 and the termination resistor.

For example, if an output impedance of the voltage/current control unit 12 is 50Ω, and an input impedance of a signal processing unit 302 is 1 MΩ, the termination resistor of 50Ω is provided as described in the above. The combination of the signal processing unit 302 and the termination resistor can be regarded as one signal processing unit whose input impedance corresponds to 49.99 . . . Ω, which is a combined resistance of a resistance of 1 MΩ and a resistance 50Ω connected in parallel. In this manner, an input impedance of the signal processing unit is substantially the same as an output impedance of the voltage/current control unit 12, for example.

The above describes the output impedance of the voltage/current control unit 12 and the input impedance of the signal processing unit 302 while focusing on connection with one electrode. The same applies to the other electrodes contained in the lighting deflector 104, the projection deflector 107, and the objective deflector 110. Furthermore, an output impedance of the voltage/current control unit 12 may be the same between connections with the electrodes of the lighting deflector 104, the projection deflector 107, and the objective deflector 110.

As described in the above, regarding a connection with each electrode, if an output impedance of the voltage/current control unit 12 and an input impedance of the signal processing unit 302 electrically connected to the electrode are substantially the same, the advantageous effects described below may be produced.

For example, the following will describe the case in which the electron beam drawing apparatus 1 is designed to be in a beam OFF state when a voltage that the voltage/current control unit 12 applies to an electrode of the lighting deflector 104 falls beyond a range. Regarding a connection with the electrode, if an input impedance of the signal processing unit 302A electrically connected to the electrode is substantially the same as an output impedance of the voltage/current control unit 12, the signal processing unit 302A can measure a voltage that is actually applied to the electrode due to a discharge. Therefore, if a discharge is detected as described in the above, and the signal processing unit 302A measures a voltage applied to the electrode by this discharge and this value falls beyond the range, the following prediction can be made. That is, it can be predicted that there will be a period in which the electron beam 100 cannot pass through the aperture of the second aperture member 105 and thus the dose amount of the electron beam 100 for use in drawing is decreased.

Furthermore, depending on the voltage that the voltage/current control unit 12 applies to each of the electrodes of the projection deflector 107, how the electron beam 100 that passes through the third aperture member 108 changes in shape and dimension can be known in advance. Regarding a connection with each of the electrodes of the projection deflector 107, if an input impedance of the signal processing unit 302B electrically connected to the electrode is substantially the same as an output impedance of the voltage/current control unit 12, the signal processing unit 302B can measure a voltage that is actually applied to the electrode due to a discharge. Therefore, a discharge is detected as described in the above, and based on a voltage that is applied to each of the electrodes based on this discharge and is measured by the signal processing unit 302B, the following prediction can be made. That is, how the electron beam 100 that passes through the third aperture member 108 changes in shape and dimension due to the discharge can be predicted.

An influence of a discharge on the electron beam 100, which can be predicted in this manner, may affect drawing on the sample 21 performed using electron beam 100. Thus, among detected discharges, a discharge that is particularly likely to lead to a drawing pattern error may be identified by collation with the drawing pattern error.

Other Embodiments

The above describes that the discharge detection processing is performed while various types of control are exerted on the path of the electron beam. The control on the path of the electron beam is not limited to the one described in the above. For example, among eight electrodes of the projection deflector, four electrodes alternately located around the reference line may be electrically connected to the voltage/ current control unit, and the beam path control unit may control the path of the electron beam by using these four electrodes. This enables, for example, a simulation of a state in which drawing is performed on a sample, for example. In this case, the remaining four electrodes of the eight electrodes of the projection deflector may be connected to the signal processing unit, and the discharge detection processing may be performed based on voltage data items respectively corresponding to these four electrodes. Instead of or in addition to the projection deflector, each of the electrodes of the objective deflector may be used in a similar manner.

While detecting a discharge, in order to deflect an electron beam, a coil that changes the magnetic field on a path of an electron beam does not necessarily surround the path of the electron beam. For example, the magnetic field on the path of the electron beam may be changed to deflect the electron beam by using a coil that does not surround the path of the electron beam.

The above describes, as an example, the case in which each electrode contained in a deflector is electrically connected to a discharge detection unit, and based on a potential of the electrode, the discharge detection unit performs the discharge detection processing. However, this case is not necessarily a limitation. The other electrodes present in a charged particle beam emitting apparatus may be electrically connected to the discharge detection unit, and based on a potential of the electrode, the discharge detection processing may be performed by the discharge detection unit.

Throughout this description, a "connection" indicates an electrical connection, and does not exclude, for example, a connection via another element.

Throughout this description, use of expressions such as "the same", "coincide with", "fixed", "maintain", etc., is intended to encompass a case in which a deviation occurs within a design range when carrying out the technique described in the embodiments. Furthermore, use of expressions such as "applying or supplying a voltage" is intended to encompass both performing control in such a manner as to apply or supply the voltage and actually applying or supplying the voltage. Furthermore, applying or supplying a voltage may encompass applying or supplying a voltage of, for example, 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

In the embodiments described above, descriptions for portions which are not directly required for explaining the present invention, such as detailed configurations of devices and control methods, are omitted. However, it should be noted that the configurations of the devices and the control methods can be suitably selected and used as required. All detection methods and detection apparatuses that comprise the elements of the present invention and that can be suitably modified by a person with ordinary skill in the art are encompassed in the scope of the present invention.

What is claimed is:

1. A method for detecting a discharge site for a charged particle beam emitting apparatus including a first mode and a second mode in a switchable manner, the first mode enabling a beam of charged particles to be deflected by applying voltages to a plurality of electrodes, the second mode enabling acquisition of data items indicative of potential of each of the electrodes while the beam is being emitted without applying the voltages, the method comprising:
  in the second mode, detecting an occurrence of a discharge when a fluctuation in potential indicated by data items relating to one of the electrodes exceed a predetermined threshold value;
  detecting a site corresponding to the electrode, as a site having an occurrence of the discharge; and
  acquiring data items respectively indicating a potential of the electrodes in a state in which the beam is deflected on a path of the beam in response to a change in electric field caused by applying voltages to the electrodes.

2. The method according to claim 1, further comprising detecting, when fluctuations in potential indicated by data items relating to two or more of the electrodes exceed a predetermined threshold value, a site corresponding to the electrode having the largest fluctuation, as a site having an occurrence of a discharge.

3. The method according to claim 1, further comprising detecting, when fluctuations in potential indicated by data items relating to two or more of the electrodes exceed a predetermined threshold value, a site corresponding to the electrode having the earliest peak timing in potential, as a site having an occurrence of a discharge.

4. A method for detecting a discharge site for a charged particle beam emitting apparatus including a first mode and a second mode in a switchable manner, the first mode enabling a beam of charged particles to be deflected by applying voltages to a plurality of electrodes, the second mode enabling acquisition of data items indicative of potential of each of the electrodes while the beam is being emitted without applying the voltages, the method comprising:
  in the second mode, detecting an occurrence of a discharge when a fluctuation in potential indicated by data items relating to one of the electrodes exceed a predetermined threshold value;
  detecting a site corresponding to the electrode, as a site having an occurrence of the discharge; and
  acquiring data items respectively indicating a potential of the electrodes in a state in which the beam passes on a path of the beam through each aperture of a plurality of aperture members provided on a path of the beam in response to a change in electric field caused by applying voltages to the electrodes.

5. A method for detecting a discharge site for a charged particle beam emitting apparatus including a first mode and a second mode in a switchable manner, the first mode enabling a beam of charged particles to be deflected by applying voltages to a plurality of electrodes, the second mode enabling acquisition of data items indicative of potential of each of the electrodes while the beam is being emitted without applying the voltages, the method comprising:
  in the second mode, detecting an occurrence of a discharge when a fluctuation in potential indicated by data items relating to one of the electrodes exceed a predetermined threshold value;
  detecting a site corresponding to the electrode, as a site having an occurrence of the discharge; and
  acquiring data items respectively indicating a potential of the electrodes in a state in which the beam is applied on its path to a position different from an aperture of an aperture member provided on a path of the beam in response to a change in electric field caused by applying voltages to the electrodes.

6. The method according to claim 1, further comprising:
acquiring, with a plurality of current detectors provided in the charged particle beam emitting apparatus, first data items respectively indicating a fluctuation in electric field in a vicinity of each of the detectors;
storing, when an occurrence of a discharge is detected, one of the first data items in such a manner that the first data item is correlated with an electrode relating to detection of the occurrence of the discharge;
acquiring, after the storing, second data items respectively indicating a fluctuation in electric field in a vicinity of each of the detectors; and
detecting a discharge occurring in a vicinity of the electrode based on a comparison between the first data item and the second data items.

7. An apparatus for detecting a discharge site, comprising:
a plurality of electrodes which deflect a beam of charged particles based on voltages applied to the electrodes;
a signal processing unit which acquires data items indicative of potential of each of the electrodes in a state in which a connection destination of the electrodes is switched from a supply source of the applied voltage; and
a control unit which detects, as an occurrence of a discharge, when a fluctuation in potential indicated by data items exceeds a threshold value, and detects a site corresponding to the electrode relating to the data items indicative of the fluctuation in potential as a site having an occurrence of a discharge,
wherein data items respectively indicating a potential of the electrodes in a state in which the beam is deflected on a path of the beam in response to a change in electric field caused by applying voltages to the electrodes are acquired.

8. The apparatus according to claim 7, wherein the signal processing unit has an impedance substantially equal to an output impedance of the supply source of the voltage.

9. The apparatus according to claim 7, wherein the control unit detects, when fluctuations in potential indicated by data items relating to two or more of the electrodes exceed a predetermined threshold value, a site corresponding to the electrode having the largest fluctuation, as a site having an occurrence of a discharge.

10. The apparatus according to claim 7, wherein the control unit detects, when fluctuations in potential indicated by data items relating to two or more of the electrodes exceed a predetermined threshold value, a site corresponding to the electrode having the earliest peak timing in potential, as a site having an occurrence of a discharge.

11. An apparatus for detecting a discharge site, comprising:
a plurality of electrodes which deflect a beam of charged particles based on voltages applied to the electrodes;
a signal processing unit which acquires data items indicative of potential of each of the electrodes in a state in which a connection destination of the electrodes is switched from a supply source of the applied voltage; and
a control unit which detects, as an occurrence of a discharge, when a fluctuation in potential indicated by data items exceeds a threshold value, and detects a site corresponding to the electrode relating to the data items indicative of the fluctuation in potential as a site having an occurrence of a discharge,
wherein data items respectively indicating a potential of the electrodes in a state in which the beam passes on a path of the beam through each aperture of a plurality of aperture members provided on a path of the beam in response to a change in electric field caused by applying voltages to the electrodes are acquired.

12. An apparatus for detecting a discharge site, comprising:
a plurality of electrodes which deflect a beam of charged particles based on voltages applied to the electrodes;
a signal processing unit which acquires data items indicative of potential of each of the electrodes in a state in which a connection destination of the electrodes is switched from a supply source of the applied voltage; and
a control unit which detects, as an occurrence of a discharge, when a fluctuation in potential indicated by data items exceeds a threshold value, and detects a site corresponding to the electrode relating to the data items indicative of the fluctuation in potential as a site having an occurrence of a discharge,
wherein data items respectively indicating a potential of the electrodes in a state in which the beam is applied on its path to a position different from an aperture of an aperture member provided on a path of the beam in response to a change in electric field caused by applying voltages to the electrodes are acquired.

13. The apparatus according to claim 7, wherein the control unit:
acquires, with a plurality of current detectors, first data items respectively indicating a fluctuation in electric field in a vicinity of each of the detectors;
stores, when an occurrence of a discharge is detected, one of the first data items in such a manner that the first data item is correlated with an electrode relating to detection of the occurrence of the discharge;
acquires, after the storing, second data items respectively indicating a fluctuation in electric field in a vicinity of each of the detectors; and
detects a discharge occurring in a vicinity of the electrode based on a comparison between the first data item and the second data items.

* * * * *